(12) United States Patent
Ohnuma et al.

(10) Patent No.: US 8,008,169 B2
(45) Date of Patent: Aug. 30, 2011

(54) METHOD FOR MANUFACTURING PHOTOELECTRIC CONVERSION DEVICE

(75) Inventors: Hideto Ohnuma, Kanagawa (JP); Takashi Hirose, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 238 days.

(21) Appl. No.: 12/341,699

(22) Filed: Dec. 22, 2008

(65) Prior Publication Data

US 2010/0047952 A1 Feb. 25, 2010

(30) Foreign Application Priority Data

Dec. 28, 2007 (JP) ................................. 2007-338578

(51) Int. Cl.
*H01L 21/84* (2006.01)
(52) U.S. Cl. .................. 438/479; 257/E21.561; 438/151
(58) Field of Classification Search .......... 438/479–481, 438/151–166; 257/E21.561
See application file for complete search history.

(56) References Cited

U.S. PATENT DOCUMENTS

| | | | |
|---|---|---|---|
| 4,180,618 A | 12/1979 | Alpha et al. | |
| 4,409,134 A | 10/1983 | Yamazaki | |
| 4,496,788 A | 1/1985 | Hamakawa et al. | |
| 4,633,034 A | 12/1986 | Nath et al. | |
| 4,727,047 A | 2/1988 | Bozler et al. | |
| 4,816,420 A | 3/1989 | Bozler et al. | |
| 5,304,407 A | 4/1994 | Hayashi et al. | |
| 5,371,037 A | 12/1994 | Yonehara | |
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,665,607 A | 9/1997 | Kawama et al. | |
| 5,701,167 A | 12/1997 | Yamazaki | |
| 5,736,431 A | 4/1998 | Shinohara et al. | |

(Continued)

FOREIGN PATENT DOCUMENTS

JP 62-062073 B 12/1987

(Continued)

OTHER PUBLICATIONS

Kiyoshi Yasutake et al., "Low-Temperature and High-Rate Epitaxial Growth in Si by Atmospheric-Pressure Plasma CVD Method", Oyobuturi; Sep. 10, 2007; pp. 1031-1036; vol. 76, No. 9; JSAP (the Japan Society of Applied Physics); with full English translation.

(Continued)

*Primary Examiner* — Richard A. Booth
(74) *Attorney, Agent, or Firm* — Fish & Richardson P.C.

(57) ABSTRACT

A fragile layer is formed in a single crystal silicon substrate, a first impurity silicon layer is formed on the one surface side in the single crystal silicon substrate, and a first electrode is formed thereover. After one surface of a supporting substrate and the first electrode are bonded, the single crystal silicon substrate is separated along the fragile layer to form a single crystal silicon layer over the supporting substrate. Crystal defect repair treatment or crystal defect elimination treatment of the single crystal silicon layer is performed; then, epitaxial growth is conducted on the single crystal silicon layer by activating a source gas containing at least a silane-based gas with plasma generated at atmospheric pressure or near atmospheric pressure. A second impurity silicon layer is formed on a surface side in the single crystal silicon layer which is epitaxial grown.

50 Claims, 21 Drawing Sheets

U.S. PATENT DOCUMENTS

| | | | |
|---|---|---|---|
| 5,750,000 | A | 5/1998 | Yonehara et al. |
| 5,811,348 | A | 9/1998 | Matsushita et al. |
| 5,840,616 | A | 11/1998 | Sakaguchi et al. |
| 5,849,601 | A | 12/1998 | Yamazaki |
| 5,854,123 | A | 12/1998 | Sato et al. |
| 5,859,445 | A | 1/1999 | Yamazaki |
| 5,932,302 | A | 8/1999 | Yamazaki et al. |
| 5,968,274 | A | 10/1999 | Fujioka et al. |
| 6,011,277 | A | 1/2000 | Yamazaki |
| 6,023,075 | A | 2/2000 | Yamazaki |
| 6,087,648 | A | 7/2000 | Zhang et al. |
| 6,171,674 | B1 | 1/2001 | Yamazaki et al. |
| 6,183,816 | B1 | 2/2001 | Yamazaki et al. |
| 6,190,937 | B1 | 2/2001 | Nakagawa et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,331,208 | B1 | 12/2001 | Nishida et al. |
| 6,372,609 | B1 | 4/2002 | Aga et al. |
| 6,380,046 | B1 | 4/2002 | Yamazaki |
| 6,387,829 | B1 | 5/2002 | Usenko et al. |
| 6,468,617 | B1 | 10/2002 | Yamazaki et al. |
| 6,534,380 | B1 | 3/2003 | Yamauchi et al. |
| 6,566,277 | B1 | 5/2003 | Nakagawa et al. |
| 6,605,518 | B1 | 8/2003 | Ohmi et al. |
| 6,656,271 | B2 | 12/2003 | Yonehara et al. |
| 6,692,981 | B2 | 2/2004 | Takato et al. |
| 6,737,676 | B2 | 5/2004 | Yamazaki |
| 6,818,529 | B2 | 11/2004 | Bachrach et al. |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,211,454 | B2 | 5/2007 | Yamazaki et al. |
| 7,229,862 | B2 | 6/2007 | Yamazaki et al. |
| 7,253,391 | B2 | 8/2007 | Koyama et al. |
| 7,301,215 | B2 | 11/2007 | Kariya |
| 7,432,468 | B2 | 10/2008 | Oka et al. |
| 2003/0062129 | A1 | 4/2003 | Ni |
| 2003/0119280 | A1* | 6/2003 | Lee et al. ............ 438/459 |
| 2003/0143822 | A1 | 7/2003 | Kondo et al. |
| 2004/0056332 | A1 | 3/2004 | Bachrach et al. |
| 2004/0221809 | A1 | 11/2004 | Ohmi et al. |
| 2004/0253896 | A1 | 12/2004 | Yamazaki |
| 2005/0012887 | A1 | 1/2005 | Koyama |
| 2005/0022864 | A1 | 2/2005 | Fujioka |
| 2005/0089648 | A1 | 4/2005 | Yamazaki |
| 2006/0225656 | A1 | 10/2006 | Horiguchi |
| 2006/0238132 | A1 | 10/2006 | Kitamura et al. |
| 2006/0246738 | A1 | 11/2006 | Isobe |
| 2007/0018165 | A1 | 1/2007 | Yamazaki |
| 2007/0057258 | A1 | 3/2007 | Fukuchi et al. |
| 2007/0163996 | A1 | 7/2007 | Horiguchi |
| 2008/0099065 | A1 | 5/2008 | Ito et al. |
| 2008/0160661 | A1 | 7/2008 | Henley |
| 2008/0245406 | A1 | 10/2008 | Yamazaki et al. |
| 2008/0299689 | A1 | 12/2008 | Yamazaki |
| 2009/0029498 | A1 | 1/2009 | Yamazaki et al. |
| 2009/0029503 | A1 | 1/2009 | Arai et al. |
| 2009/0047752 | A1 | 2/2009 | Yamazaki et al. |
| 2009/0142879 | A1 | 6/2009 | Isaka et al. |
| 2009/0142908 | A1 | 6/2009 | Isaka et al. |

FOREIGN PATENT DOCUMENTS

| | | |
|---|---|---|
| JP | 02-053941 B | 11/1990 |
| JP | 10-093122 | 4/1998 |
| JP | 10-093122 A | 4/1998 |
| JP | 10-335683 | 12/1998 |
| JP | 10-335683 A | 12/1998 |
| JP | 11-103082 A | 4/1999 |
| JP | 11-163363 | 6/1999 |
| JP | 2000-150940 | 5/2000 |
| JP | 2000-277439 A | 10/2000 |
| JP | 2002-261018 A | 9/2002 |
| JP | 2002-348198 | 12/2002 |
| JP | 2004-014958 A | 1/2004 |
| JP | 2005-049832 A | 2/2005 |
| JP | 2005-268682 | 9/2005 |
| JP | 2007-005705 A | 1/2007 |
| JP | 2007-048982 A | 2/2007 |

OTHER PUBLICATIONS

Arai,T et al., "41.2: Micro Silicon Technology for Active Matrix OLED Display," SID Digest '07 : SID International Symposium Digest of Technical Papers, 2007, vol. 38, pp. 1370-1373.

* cited by examiner

METHOD FOR MANUFACTURING PHOTOELECTRIC CONVERSION DEVICE

BACKGROUND OF THE INVENTION

1. Field of the Invention

The present invention relates to photoelectric conversion devices using single crystal silicon or polycrystalline silicon or to a method for manufacturing the photoelectric conversion devices.

2. Description of the Related Art

Global warming is an important issue which requires international efforts. Green house gases such as carbon dioxide, which are the major cause of global warming, are emitted from energy such as oil, coal, and natural gas. These energy are essential for industrial society; accordingly, under present circumstances, it is not possible to simply reduce the amount of energy used. Therefore, as an energy source for the next generation, solar photovolatics, which are environmentally friendly and emit less carbon dioxide, has attracted attention and has been widespread.

Solar photovolatics may utilize solar heat, but mainly employs photoelectric conversion devices (also referred to as solar batteries or photovoltaic devices), which convert light energy to electrical energy by utilizing semiconductor characteristics.

Photoelectric conversion devices typified by solar batteries have been already available in the market and the production thereof has been expanding year by year, supported by government measures for solar cells around the world. For example, the production of solar cells around the world in 2006 was 2521 MW and is increasing by more than 40% per annum. Photoelectric conversion devices including crystalline semiconductor have become popular worldwide, and a large part of the production is occupied by the devices including single crystal silicon substrates or polycrystalline silicon substrates.

With the increase in production of photoelectric conversion devices year by year, shortage of supply and rise in price of silicon, which is a raw material, have become serious problems in industry. In the supply-demand balance of silicon, which had been excess in supply reflecting semiconductor recession, silicon has been short of supply since around fiscal 2005 due to drastic expansion of the solar battery market in addition to the recovery of semiconductor (LSI) industry. Major silicon suppliers in the world have already tried to increase their capability of silicon production, but the increase in demand outweighs the capability. Accordingly, the shortage of supply seems to continue for some time. If such a state continues, spread of solar batteries may be seriously suppressed.

Silicon photoelectric conversion devices are classified into a bulk type, a thin film type, a single crystal type, a polycrystalline type, and the like depending on the crystal states or device structures. Bulk silicon photoelectric conversion devices occupy a large part of the present production because they can achieve a sufficient photoelectric conversion efficiency. In a typical structure of a bulk silicon photoelectric conversion device, a single crystal silicon substrate or a polycrystalline silicon substrate is provided with an n-type or a p-type diffusion layer. In order to absorb sunlight, the silicon photoelectric conversion device only needs to have a photoelectric conversion layer with a thickness of about 10 μm; however, a single crystal silicon substrate or a polycrystalline silicon substrate has a thickness several tens times or more the thickness needed as the photoelectric conversion layer. Therefore, it is difficult to say that silicon is efficiently used as a raw material. To put it in extreme terms, in a bulk silicon photoelectric conversion device, the most part of the single crystal silicon substrate or the polycrystalline silicon substrate serves as a structural body which keeps the shape of the photoelectric conversion device.

In a thin film silicon photoelectric conversion device, a silicon layer provided over a supporting substrate serves as a photoelectric conversion layer. Since a silicon layer is employed only in a region which conducts photoelectric conversion, the consumption of silicon can be drastically reduced compared with a bulk silicon photoelectric conversion device. In addition, if a glass substrate or the like which can have a large area and is inexpensive can be used as a supporting substrate, it is possible to approach a cost problem which is one of the problems which disturb the spread of solar batteries.

In a conventional thin film silicon photoelectric conversion device, since a silicon layer is formed over a supporting substrate by various kinds of physical or chemical growth methods, single crystal silicon cannot be formed; accordingly, a non-single-crystal silicon layer such as an amorphous silicon layer, a microcrystalline silicon layer, or a polycrystalline silicon layer is used. Non-single-crystal silicon has lower photoelectric conversion characteristics than single crystal silicon; therefore, thin film silicon photoelectric conversion devices have not achieved a sufficient photoelectric conversion efficiency. Therefore, the use of a hydrogen ion implantation separation method has been proposed in which a single crystal silicon layer is formed over a supporting substrate to serve as a photoelectric conversion layer. Further, epitaxial growth, by a chemical vapor deposition method, of the single crystal silicon layer formed over the supporting substrate has also been proposed (for example, see Patent Document 1: Japanese Published Patent Application No. H10-93122).

Further, an atmospheric pressure plasma CVD method is known as a method to epitaxially grow a silicon layer (see Patent Document 2: Japanese Patent No. 3480448).

SUMMARY OF THE INVENTION

However, by a technique such as a hydrogen ion implantation separation method in which a thin superficial layer of a single crystal silicon substrate is separated as a single crystal silicon layer, generation of crystal defects in a hydrogen ion implantation process or separation process cannot be prevented.

By an atmospheric pressure plasma CVD method, a silicon layer can be epitaxially grown at high-speed. However, if there is a crystal defect in a single crystal silicon layer serving as a seed layer, epitaxial growth does not progress well, and a favorable single crystal silicon layer cannot be formed. If there is a crystal defect of the like in a region which conducts photoelectric conversion, the crystal defect may serve as a recombination center of carriers, which may lead to decrease in photoelectric conversion efficiency.

In view of the foregoing problems, it is an object of the present invention to manufacture a photoelectric conversion device having an excellent photoelectric conversion characteristic as well as to effectively utilize limited resources.

A method for manufacturing a photoelectric conversion device is provided in which a single crystal silicon layer which conducts photoelectric conversion is formed by an epitaxial growth technique using a chemical vapor deposition (CVD) method, specifically, an atmospheric pressure plasma chemical vapor deposition method (hereinafter, referred to as an atmospheric pressure plasma CVD method). A thin superficial layer is separated from a single crystal silicon substrate, and thus obtained single crystal silicon layer is fixed over a supporting substrate. After crystal defects in the single crystal silicon layer which is fixed over the supporting substrate are reduced, epitaxial growth is conducted to increase the thickness of the single crystal silicon layer by an atmospheric pressure plasma CVD method. By utilizing an atmospheric pressure plasma CVD method, time took for epitaxial growth to obtain a desired thickness can be reduced compared to the case of utilizing a general low pressure plasma CVD method.

The single crystal silicon layer which is obtained by separating a thin slice from the single crystal silicon substrate is subjected to crystal defect repair treatment or crystal defect elimination treatment in order to reduce crystal defects, then, epitaxial growth is conducted by an atmospheric pressure plasma CVD method. As crystal defect repair treatment or crystal defect elimination treatment, there are laser irradiation, RTA treatment, flash lamp irradiation, etching treatment, a CMP treatment, and the like. Over a thus treated single crystal silicon layer, a silicon layer is formed at the same time as epitaxial growth is conducted using the single crystal silicon layer thereunder as a seed layer by an atmospheric pressure plasma CVD method.

Note that single crystals are crystals whose crystal faces and crystal axes are aligned and whose atoms or molecules are spatially ordered. However, although single crystals are structured by orderly aligned atoms, single crystals may include a lattice defect in which the alignment is partially disordered or single crystals may include intended or unintended lattice distortion.

According to an aspect of the present invention, a method for manufacturing a photoelectric conversion device includes: forming a fragile layer in a region at a predetermined depth from one surface of a single crystal silicon substrate by irradiating the single crystal silicon substrate with ions or cluster ions through the one surface; forming a first impurity silicon layer on the one surface side in the single crystal silicon substrate; forming a first electrode over the first impurity silicon layer; disposing a supporting substrate and the single crystal silicon substrate so that one surface of the supporting substrate and the one surface of the single crystal silicon substrate face each other, and bonding the one surface of the supporting substrate and the first electrode; performing heat treatment to separate the single crystal silicon substrate along the fragile layer and to form a single crystal silicon layer over the supporting substrate; performing crystal defect repair treatment or crystal defect elimination treatment of the single crystal silicon layer; epitaxially growing the single crystal silicon layer by activating a source gas containing at least a silane-based gas with plasma generated at atmospheric pressure or near atmospheric pressure; and forming a second impurity silicon layer on a surface of the single crystal silicon layer which is epitaxial grown.

According to an aspect of the present invention, a method for manufacturing a photoelectric conversion device includes: forming a fragile layer in a region at a predetermined depth from one surface of a single crystal silicon substrate by irradiating the single crystal silicon substrate with ions or cluster ions through the one surface; forming a first impurity silicon layer on the one surface side of the single crystal silicon substrate; forming a first electrode and an insulating layer over the first impurity silicon layer; disposing a supporting substrate and the single crystal silicon substrate so that one surface of the supporting substrate and the one surface of the single crystal silicon substrate face each other, and bonding the one surface of the supporting substrate and the insulating layer; performing heat treatment to separate the single crystal silicon substrate along the fragile layer and to form a single crystal silicon layer over the supporting substrate; performing crystal defect repair treatment or crystal defect elimination treatment of the single crystal silicon layer; epitaxially growing the single crystal silicon layer by activating a source gas containing at least a silane-based gas with plasma generated at atmospheric pressure or near atmospheric pressure; and forming a second impurity silicon layer on a surface of the single crystal silicon layer which is epitaxial grown.

In the above structures, the atmospheric pressure or near atmospheric pressure is in a range of 0.1 atm to 10 atm, preferably 0.2 atm to 2 atm.

In the above structures, the silane-based gas is silane, disilane, or trisilane. Further, a rare gas or hydrogen can be added to the source gas.

In the above structure, a region of the single crystal silicon layer which is epitaxially grown can be an intrinsic semiconductor.

Note that "intrinsic semiconductor (i-type semiconductor)" in this specification refers to a semiconductor which is intrinsic or substantially intrinsic, and indicates a semiconductor which contains an impurity element imparting one conductivity type (an impurity element imparting p-type conductivity or n-type conductivity) at a concentration of $1\times10^{20}/cm^3$ or less and oxygen and nitrogen each at a concentration of $9\times10^{19}/cm^3$ or less, and which has photoconductivity 100 times or more the dark conductivity. An intrinsic semiconductor sometimes has weak n-type conductivity when an impurity element for controlling valence electrons is not added intentionally. Further, boron may be added to an intrinsic semiconductor at 1 ppm to 1000 ppm. For example, an impurity element imparting p-type conductivity is added at the same time as or after the film formation, in some cases. The impurity element imparting p-type conductivity is typically boron, and an impurity gas such as $B_2H_6$ or $BF_3$ may be mixed into a semiconductor material gas at a rate of 1 ppm to 1000 ppm. The concentration of boron may be, for example, $1\times10^{14}/cm^3$ to $6\times10^{16}/cm^3$.

Further, in the foregoing structures, the cluster ions preferably include high proportion of $H_3^+$ ions.

Further, a third impurity silicon layer having one conductivity type, a non-single-crystal silicon layer, and a fourth impurity silicon layer having a conductivity type opposite to the one conductivity type may be formed over the second impurity silicon layer.

A photoelectric conversion device with a higher photoelectric conversion efficiency can be manufactured with reduced consumption of resources because a layer conducting photoelectric conversion is formed by increasing the thickness of a single crystal silicon layer having reduced crystal defects with a crystal epitaxial growth technique using an atmospheric pressure plasma CVD method. Moreover, the consumption of single crystal silicon, which is a raw material, can be reduced by separating a thin superficial portion from a single crystal silicon substrate and bonding the portion to the supporting substrate as a single crystal silicon layer. Furthermore, the single crystal silicon substrate from which the single crystal silicon layer has been separated can be reused. Thus, the resources can be effectively utilized and a photoelectric conversion device having an excellent photoelectric conversion characteristic can be manufactured.

DETAILED DESCRIPTION OF THE INVENTION

Figure 1A:
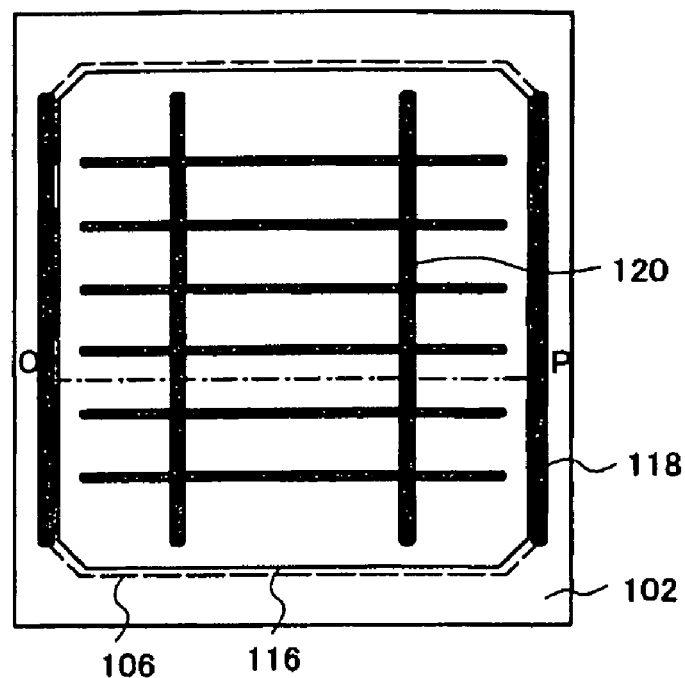
FIG. 1A is a top view and FIG. 1B is a cross-sectional view illustrating an example of a photoelectric conversion device according to an aspect of the present invention.

Hereinafter, embodiment modes of the present invention will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiment modes to be given below. Note that same portions in the drawings may be denoted by the same reference numerals in a structure of the present invention to be described below.

Embodiment Mode 1

Figure 1B:
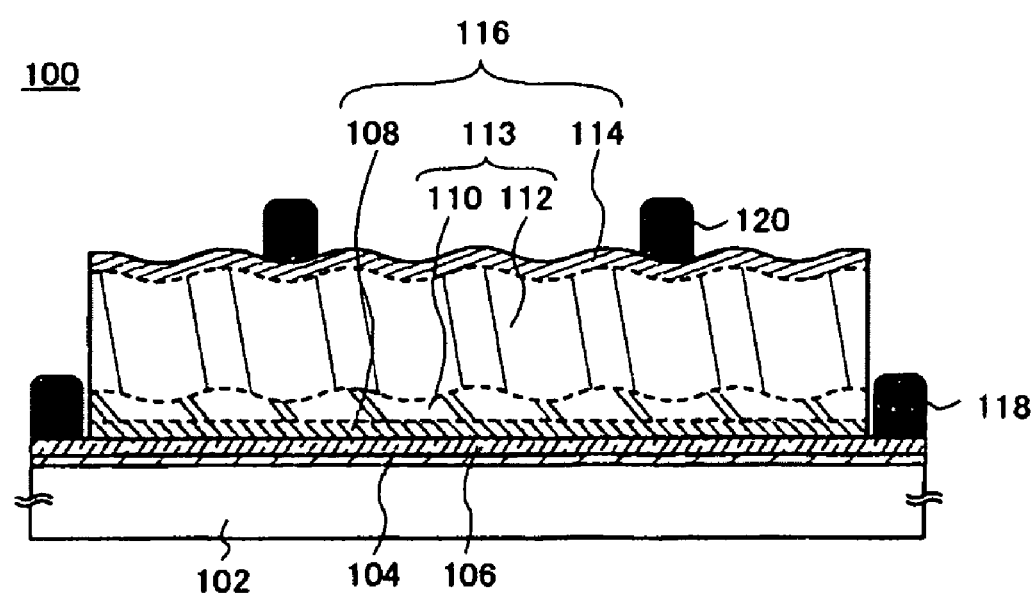

FIG. 1A is a schematic top diagram and FIG. 1B is a schematic cross-sectional diagram of a photoelectric conversion device 100 according to the present invention. Note that FIG. 1B is an example of a cross-sectional view along line O-P in FIG. 1A.

The photoelectric conversion device 100 described in this embodiment mode includes a unit cell 116 having a single crystal silicon layer over the supporting substrate 102. The unit cell 116 is provided with a first electrode 106 on the supporting substrate 102 side and with a second electrode 120 on an opposite surface from the supporting substrate 102 side. The unit cell 116 is sandwiched between the first electrode 106 and the second electrode 120. In addition, an insulating layer 104 is provided between the supporting substrate 102 and the unit cell 116. The first electrode 106 is provided between the unit cell 116 and the insulating layer 104. The second electrode 120 is provided on the opposite surface of the unit cell 116 from the supporting substrate 102 side. Moreover, an auxiliary electrode 118 is provided in electrical connection with the first electrode 106. In the photoelectric conversion device 100 of this embodiment mode, the unit cell 116 is fixed over the supporting substrate 102, and an electrode serving as a positive electrode and an electrode serving as a negative electrode are provided over the same plane side of the supporting substrate 102. Further, in the case of providing an electrode which is connected to the electrode serving as a positive electrode and an electrode which is connected to the electrode serving as a negative electrode, similar to the electrode serving as a positive electrode and the electrode serving as a negative electrode, these electrodes are provided over the same plane side of the supporting substrate 102. Note that the electrode which is connected to the electrode serving as a positive electrode and the electrode which is connected to the electrode serving as a negative electrode are not necessarily formed and only one of them may be formed.

The unit cell 116 has a stacked structure in which a first impurity silicon layer 108 having one conductivity type, a single crystal silicon layer 113, and a second impurity silicon layer 114 having a conductivity type opposite to the one conductivity type are stacked in that order. Note that the first impurity silicon layer 108 may be omitted if the second impurity silicon layer 114 and a first single crystal silicon layer 110 have opposite conductivity types.

The single crystal silicon layer 113 includes the first single crystal silicon layer 110 and a second single crystal silicon layer 112. The first single crystal silicon layer 110 is a single crystal silicon layer which is a thin slice separated from a single crystal silicon substrate. The second single crystal silicon layer 112 is an epitaxial layer grown on the single crystal silicon layer which is a thin slice separated from a single crystal silicon substrate.

The first single crystal silicon layer 110 is formed by separating a thin slice from a single crystal silicon substrate. For example, irradiation with ions or cluster ions generated from a source gas containing hydrogen are conducted to introduce hydrogen at high concentration into a predetermined depth of a single crystal silicon substrate, and then heat treatment is performed thereon to separate a superficial single crystal silicon layer, whereby the first single crystal silicon layer 110 is formed. Alternatively, a single crystal silicon layer may be epitaxially grown on a porous silicon layer, and then the porous silicon layer may be cleaved to be separated by waterjetting. The first single crystal silicon layer 110 is a p-type layer if a single crystal silicon substrate from which the first single crystal silicon layer 110 is separated is a p-type substrate. The first single crystal silicon layer 110 is an n-type layer if a single crystal silicon substrate from which the first single crystal silicon layer 110 is separated is an n-type substrate.

The second single crystal silicon layer 112 can be obtained by forming a silicon layer over the first single crystal silicon layer 110 and at the same time epitaxially growing the silicon layer by an atmospheric pressure plasma CVD method. In specific, plasma is generated at atmospheric pressure or near atmospheric pressure, and a source gas is activated to form a silicon layer so that a single crystal silicon layer is grown by vapor phase epitaxy.

Since the second single crystal silicon layer 112 is grown epitaxially on the first single crystal silicon layer 110, their crystal faces and crystal axes (crystal orientation) substantially align. In addition, the second single crystal silicon layer 112, which is an epitaxial layer, is an intrinsic type (i-type).

The single crystal silicon layer 113 is a region conducting photoelectric conversion and has a thickness of at least 1 μm or more to absorb sunlight. For example, the thickness of the single crystal silicon layer 113 is 1 μm to 20 μm, preferably 1 μm to 10 μm.

Each of the first impurity silicon layer 108 having one conductivity type and the second impurity silicon layer 114 having a conductivity type opposite to the first impurity silicon layer 108 is a silicon layer to which an impurity element imparting a predetermined conductivity type is added. If the first impurity silicon layer 108 has p-type conductivity, the second impurity silicon layer 114 has n-type conductivity. Needless to say, the first impurity silicon layer 108 may have n-type conductivity and the second impurity silicon layer 114 may have p-type conductivity. An element belonging to Group 13 in the periodic table, such as boron or aluminum, is used as a p-type impurity element, and an element belonging to Group 15 in the periodic table, such as phosphorus or arsenic, is used as an n-type impurity element. The impurity element can be added by ion implantation or ion doping.

In this specification, "ion implantation" refers to a method by which ions generated from a source gas are mass separated and delivered to an object, while "ion doping" refers to a method by which ions generated from a source gas are delivered to an object without mass separation.

The first electrode 106 and the second electrode 120 are electrodes one of which is a positive electrode and the other is a negative electrode. The first electrode 106 is provided on a side of the first impurity silicon layer 108 in the unit cell 116. In addition, the second electrode 120 is provided on a side of the second impurity silicon layer 114 in the unit cell 116. Further in addition, the auxiliary electrode 118 is formed in contact with the first electrode 106. The auxiliary electrode 118 and the second electrode 120 are provided over the same plane side.

In the photoelectric conversion device described in this embodiment mode, the side provided with the second electrode 120 is a light incidence plane. As illustrated in FIG. 1A, the second electrode 120 has a grid shape (or a comb-like shape or a pectinate shape) so that an effective area where the unit cell 116 receives light is enlarged as much as possible. In the photoelectric conversion device of this embodiment mode, the area of the second electrode 120 that covers the surface of the unit cell 116 is made as small as possible to enlarge an area of the surface of the unit cell 116 which is exposed as much as possible, because light is incident on the second electrode 120 side.

As the supporting substrate 102 which fixes the unit cell 116, a substrate having an insulating surface or an insulating substrate can be used. For example, a variety of glass substrates for electronic industry such as aluminosilicate glass, aluminoborosilicate glass, or barium borosilicate glass; a quartz substrate; a ceramic substrate; a sapphire substrate; or the like can be used. A glass substrate is preferable because the glass substrate is inexpensive and can have a large area.

The insulating layer 104 is provided between the supporting substrate 102 and the unit cell 116 and fixes the supporting substrate 102 and the unit cell 116. Here, the insulating layer 104 is bonded to the supporting substrate 102 and fixes the unit cell 116 over the supporting substrate 102. That is, the insulating layer 104 can serve as a bonding layer that bonds the unit cell 116 and the supporting substrate 102 together. For example, the insulating layer 104 has an average surface roughness Ra of 0.5 nm or less, preferably 0.3 nm or less when the outermost surface of the insulating layer 104 is formed. Note that the average surface roughness (Ra) in this specification refers to centerline average roughness obtained by three-dimensional expansion of the centerline average roughness which is defined by JIS B0601 so as to apply to a plane.

Next, an example of a method for manufacturing the photoelectric conversion device 100 in this embodiment mode is described with reference to FIGS. 2A to 2E, FIGS. 3A to 3C, and FIGS. 4A to 4C.

A fragile layer 103 is formed in a region at a predetermined depth from one surface of the single crystal silicon substrate 101. In addition, the first impurity silicon layer 108 is formed on the one surface side in the single crystal silicon substrate and the first electrode 106 and the insulating layer 104 are formed over the one surface of the single crystal silicon substrate 101.

The order and method for forming the fragile layer 103, the first impurity silicon layer 108, the first electrode 106, and the insulating layer 104 are not limited; the following (1) to (4) can be given at least. (1) A protection layer is formed on one surface of a single crystal silicon substrate. A fragile layer is formed in a region at a predetermined depth in the single crystal silicon substrate by irradiating the single crystal silicon substrate with ions or cluster ions through the surface where the protection layer is formed. Then, a first impurity silicon layer is formed successively along the one surface of the single crystal silicon substrate by adding an impurity element imparting one conductivity type through the surface of the single crystal silicon substrate where the protection layer is formed. After removing the protection layer, a first electrode is formed over the first impurity silicon layer on which the protection layer was formed, and then an insulating layer is formed over the first electrode. (2) A protection layer is formed on one surface of a single crystal silicon substrate. A first impurity silicon layer is formed along the one surface of the single crystal silicon substrate by adding an impurity element imparting one conductivity type through the surface where the protection layer is formed. Then, a fragile layer is formed successively in a region at a predetermined depth in the single crystal silicon substrate by irradiating the single crystal silicon substrate with ions or cluster ions through the surface where the protection layer is formed. After removing the protection layer, a first electrode is formed over the first impurity silicon layer on which the protection layer was formed, and then an insulating layer is formed over the first electrode. (3) A first electrode is formed on one surface of a single crystal silicon substrate. Then, a fragile layer is formed in a region at a predetermined depth in the single crystal silicon substrate by irradiating the single crystal silicon substrate with ions or cluster ions through the surface where the first electrode is formed. Further, a first impurity silicon layer is formed along the one surface of the single crystal silicon substrate by adding an impurity element imparting one conductivity type through the surface where the first electrode is formed. An insulating layer is formed over the first electrode. (4) A first electrode is formed on one surface of a single crystal silicon substrate. Then, a first impurity silicon layer is formed along the one surface of the single crystal silicon substrate by adding an impurity element imparting one conductivity type through the surface where the first electrode is formed. Further, a fragile layer is formed in a region at a predetermined depth in the single crystal silicon substrate by irradiating the single crystal silicon substrate with ions or cluster ions through the surface where the first electrode is formed. An insulating layer is formed over the first electrode. In this embodiment mode, the formation order (1) is employed.

Figure 2A:
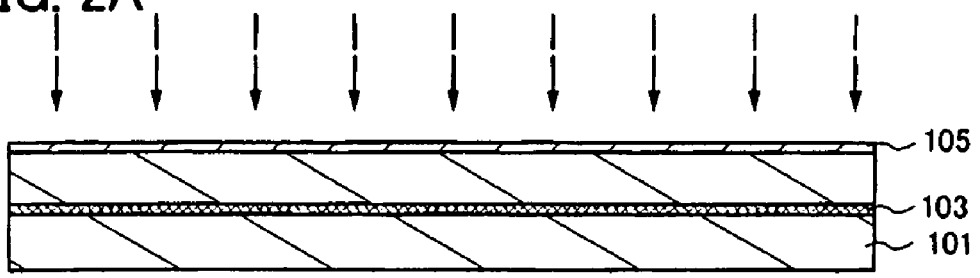
FIGS. 2A to 2E are cross-sectional views illustrating an example of a method for manufacturing a photoelectric conversion device according to an aspect of the present invention.

After a protection layer 105 is formed on one surface of the single crystal silicon substrate 101, the fragile layer 103 is formed in a region at a predetermined depth from the one surface of the single crystal silicon substrate 101 by irradiating the single crystal silicon substrate with ions or cluster ions through the one surface on which the protection layer 105 is formed (see FIG. 2A).

The planar shape of the single crystal silicon substrate 101 is not particularly limited but is preferably substantially rectangular if a supporting substrate to which the single crystal silicon substrate 101 is later fixed is rectangular in shape. For example, a p-type single crystal silicon substrate with a resistivity of about 1 Ωcm to 40 Ωcm can be used as the single crystal silicon substrate 101. Further, a polycrystalline silicon substrate may be used instead of a single crystal silicon substrate.

Figure 5A:
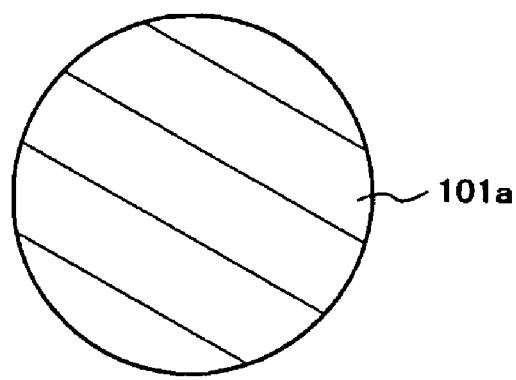
FIGS. 5A to 5D illustrate modes of cutting out a single crystal silicon substrate with a predetermined shape from a circular single crystal silicon substrate.
Figure 5B:
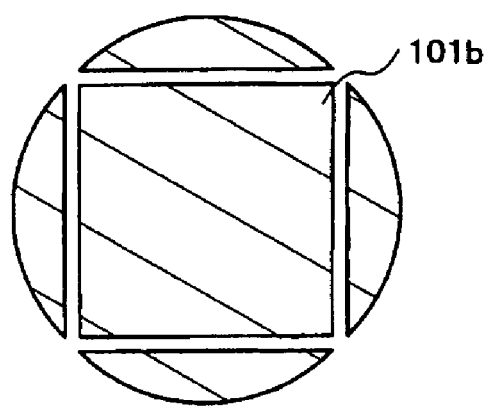
Figure 5C:
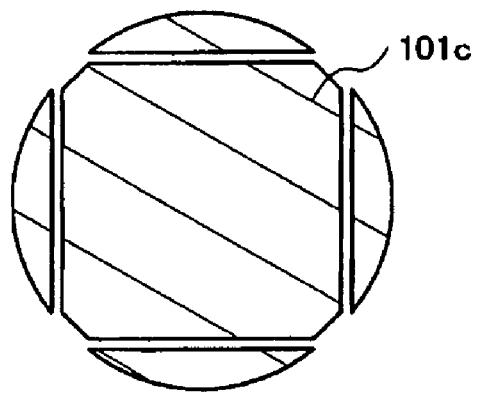
Figure 5D:
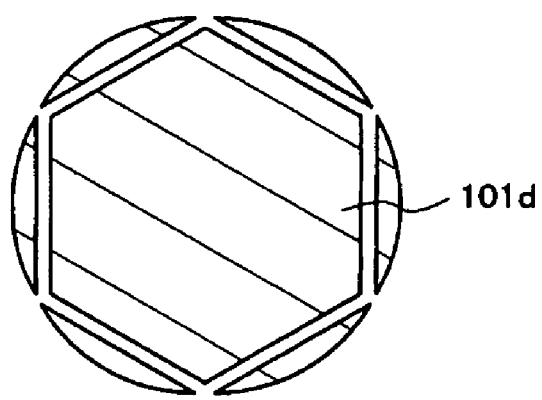

Many of single crystal silicon substrates circulating in general are circular in shape. The circular single crystal silicon substrate may be used as it is or can be cut into a predetermined shape. For example, a circular single crystal silicon substrate 101a as illustrated in FIG. 5A can be used, or a single crystal silicon substrate 101b or 101c which has a substantially rectangular shape may be cut out as illustrated in FIG. 5B or FIG. 5C. Note that FIG. 5B illustrates the case where the rectangular single crystal silicon substrate 101b which has a size of the largest rectangle inscribed in the circular single crystal silicon substrate 101a is cut out. The angle at each corner of the single crystal silicon substrate 101b is substantially 90°. FIG. 5C illustrates the case where the single crystal silicon substrate 101c in which the distance between the opposite lines is longer than that of the largest rectangular region inscribed in the circular single crystal silicon substrate 101a is cut out. The angle at each corner of the single crystal silicon substrate 101c is not 90°. The single crystal silicon substrate 101c has a polygonal shape, not a rectangular shape. Alternatively, as illustrated in FIG. 5D, a hexagonal single crystal silicon substrate 101d may be cut out. FIG. 5D illustrates the case where the hexagonal single crystal silicon substrate 101d which has a size of the largest hexagon inscribed in the circular single crystal silicon substrate 101a is cut out. By cutting a single crystal silicon substrate having a hexagonal shape, a cutting margin, that is, a waste of a raw material can be reduced compared to a case of cutting out a single crystal silicon substrate having a rectangular shape. Further, in the case of forming a solar battery module by providing one supporting substrate with a plurality of photoelectric conversion layers, if the single crystal silicon layers which form a photoelectric conversion layer have a hexagonal shape, the single crystal silicon layers can be laid tightly with less gap therebetween, compared with single crystal silicon layers having another polygonal shape.

The protection layer 105 is a layer for preventing the surface of the single crystal silicon substrate 101 from being etched or damaged during formation of the fragile layer 103 and the first impurity silicon layer 108. The protection layer 105 can be formed with a silicon oxide layer, a silicon nitride layer, a silicon oxynitride layer, or a silicon nitride oxide layer. For example, a chemical oxide with a thickness of 2 nm to 5 mm is formed as the protection layer 105 on the surface of the single crystal silicon substrate 101 with ozone water, hydrogen peroxide solution, or ozone atmosphere. An oxide layer with a thickness of 2 nm to 10 nm may be formed as the protection layer 105 on the surface of the single crystal silicon substrate 101 by a thermal oxidation method or oxygen radical treatment. Alternatively, the protection layer 105 with a thickness of 2 nm to 10 nm may be formed by a plasma CVD method.

Note that a silicon oxynitride layer in this embodiment mode means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

The fragile layer 103 is formed in a region at a predetermined depth in the single crystal silicon substrate 101 by irradiating the single crystal silicon substrate with ions or cluster ions. The ions or cluster ions are generated from a source gas containing hydrogen. As the ions or cluster ions which are generated from a source gas containing hydrogen, $H^+$ ions, $H_2^+$ ions, and $H_3^+$ ions can be given. The proportion of $H_3^+$ ions is preferably high because the introduction efficiency of hydrogen can be improved by using $H_3^+$ ions. By controlling acceleration voltage and dosage of ions or cluster ions, hydrogen can be introduced locally in a region at a predetermined depth at a high concentration in the single crystal silicon substrate 101, thus the fragile layer 103 can be formed. The fragile layer 103 preferably contains hydrogen atoms at $5 \times 10^{20}$ atoms/cm$^3$ or more.

The thickness of the single crystal silicon layer which is separated from the single crystal silicon substrate 101, that is, the thickness of the first single crystal silicon layer 110 which is fixed to the supporting substrate later is decided by the depth at which the fragile layer 103 is formed. The depth at which the fragile layer 103 is formed can be controlled by acceleration voltage with which the single crystal silicon substrate 101 is irradiated with ions or cluster ions. The thinner the single crystal silicon layer which is separated from the single crystal silicon substrate 101 is, the thicker the single crystal silicon substrate remains, and the number of times of reusing the substrate can be increased. However, in order to make the single crystal silicon layer which is separated be thin, the fragile layer 103 needs to be formed in a shallow region, which means acceleration voltage needs to be low. If the acceleration voltage is low, the irradiation with ions takes longer time and the cycle time goes worse. Therefore, the fragile layer 103 needs to be formed at a depth which is decided in consideration of the productivity or the like.

By using $H_3^+$ ions, formation of the fragile layer 103 in a shallow region of the single crystal silicon substrate 101 can be facilitated compared to the case of using $H^+$ ions. For example, in the case of forming the fragile layer 103 in a region at a depth A from the one surface of the single crystal silicon substrate 10, acceleration voltage needed for $H^+$ ions is B, whereas acceleration voltage needed for $H_3^+$ ions can be about 3B. This may be because when the single crystal silicon substrate is irradiated with $H_3^+$ ions, the $H_3^+$ ions collide with atoms forming the single crystal silicon substrate or atoms forming a layer over the single crystal silicon substrate and are separated into H atoms or $H^+$ ions. Therefore, by using $H_3^+$ ions, the single crystal silicon layer which is separated is easily made thin, whereby the number of times of reusing the substrate can be increased without deterioration of the productivity.

Doping with cluster ions typified by $H_3^+$ ions can be performed with an ion doping apparatus in such a manner that hydrogen plasma is generated from a source gas containing hydrogen, and the cluster ions generated in the hydrogen plasma are accelerated for irradiation by voltage without mass separation. By using the ion doping apparatus, the single crystal silicon substrate 101 even with a large area can be uniformly doped.

For example, the fragile layer 103 can be formed by irradiating the single crystal silicon substrate with ions or cluster ions, mainly with $H_3^+$ ions, by an ion doping method at a dosage of $1 \times 10^{16}$ ions/cm$^2$ to $5 \times 10^{16}$ ions/cm$^2$. The fragile layer 103 can be formed by adding hydrogen at $3 \times 10^{16}$ atoms/cm$^2$ to $1.5 \times 10^{17}$ atoms/cm$^2$.

Note that as illustrated in FIG. 2A, by irradiating the protection layer 105 with ions or cluster ions to introduce hydrogen through the protection layer 105, damage on the single crystal silicon substrate 101 can be prevented. For example, the surface of the single crystal silicon substrate 101 can be prevented from being etched.

Figure 6:
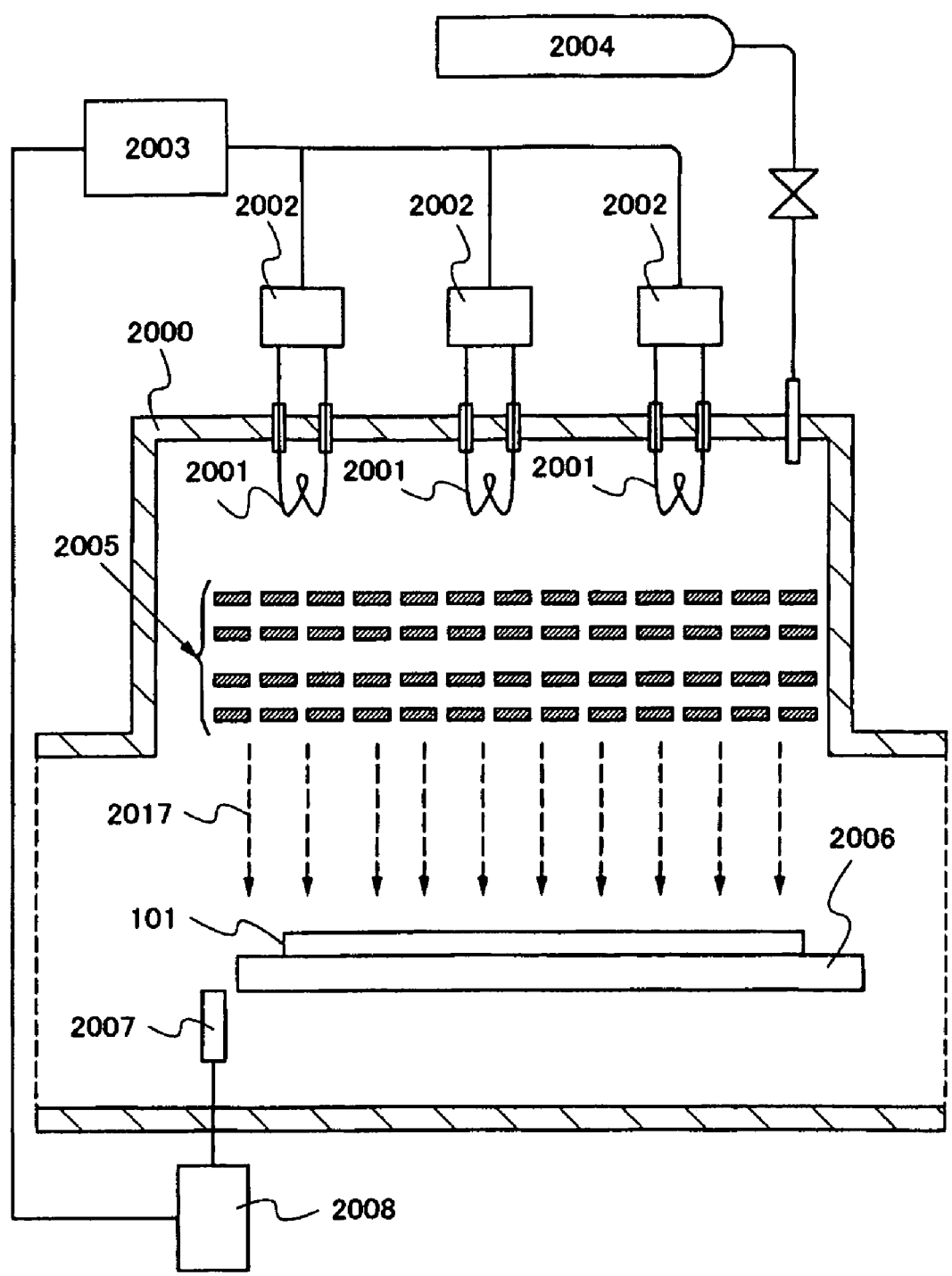
FIG. 6 is a schematic diagram illustrating a structure of an ion doping apparatus which can be applied to the present invention.

FIG. 6 is an example of a schematic diagram, which illustrates a structure of an ion doping apparatus which irradiates the single crystal silicon substrate 101 with a plurality of kinds of ions generated from an ion source 2000 without mass separation. A predetermined source gas such as hydrogen gas and the like is supplied from a gas supplying portion 2004 to the ion source 2000. The ion source 2000 is provided with filaments 2001. A filament power source 2002 applies arc discharge voltage to each filament 2001 to control the current that flows to the filament 2001. The source gas supplied from the gas supplying portion 2004 is exhausted through an exhaustion system.

The ions generated from the ion source 2000 are extracted through an extraction electrode system 2005 to form an ion beam 2017. The ion beam 2017 is delivered to the single crystal silicon substrate 101 disposed on a mounting board 2006. The proportions of the ionic species in the ion beam 2017 are calculated with a mass spectrometer tube 2007 provided in the vicinity of the mounting board 2006. The ion density calculated with the mass spectrometer tube 2007 may be converted into signals with a mass spectrometer 2008 and the results may be fed back to a power source controller 2003. The power source controller 2003 can control the filament power sources 2002 in accordance with calculation results on the ion density.

As illustrated in FIG. 6, the source gas such as hydrogen gas and the like supplied from the gas supplying portion 2004 flows through the chamber of the ion doping apparatus and is exhausted through the exhaustion system.

The irradiation of the substrate with the ion beam including a large amount of $H_3^+$ ions which are cluster ions gives advantageous effects in that the introduction efficiency of hydrogen is improved and hydrogen can be introduced to the single crystal silicon substrate 101 at a high concentration even if the dosage is low as compared with the irradiation with $H^+$ ions or $H_2^+$ ions.

When the proportion of $H_3^+$ ions is large, the fragile layer 103 can contain hydrogen at a concentration of $1 \times 10^{20}$ atoms/cm$^3$ or more, preferably $5 \times 10^{20}$ atoms/cm$^3$. When a region containing hydrogen at high concentration is formed locally in the single crystal silicon substrate 101, a crystal structure is damaged and minute voids are formed. Therefore, the fragile layer 103 formed in the single crystal silicon substrate 101 has a porous structure. Accordingly, when heat treatment is performed at relatively low temperature (600° C. or less), the minute voids formed in the fragile layer 103 change in volume, whereby the single crystal silicon substrate 101 can be separated along the fragile layer 103. The concentration of hydrogen contained in the fragile layer 103 can be controlled by the dosage, acceleration voltage, or the like of the ions or cluster ions.

Note that the depth at which the fragile layer 103 is formed can be uniform when the ions or cluster ions are introduced by scanning the surface of the single crystal silicon substrate 101 with a linear ion beam longer than one side of the single crystal silicon substrate 101 with an approximately rectangular shape.

Figure 2B:
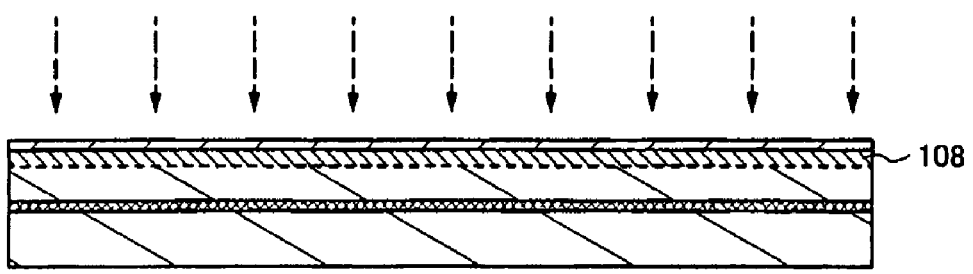

Then, the first impurity silicon layer 108 is formed along the one surface of the single crystal silicon substrate 101 by adding an impurity element imparting one conductivity type through the one surface on which the protection layer 105 is formed (see FIG. 2B). The impurity element passes through the protection layer 105 to be added to the single crystal silicon substrate 101, whereby the first impurity silicon layer 108 is formed between the single crystal silicon substrate 101 and the protection layer 105.

The first impurity silicon layer 108 is formed by adding an impurity element imparting one conductivity type by an ion doping or an ion implantation method. For example, boron is added as an impurity element imparting one conductivity to form the p-type first impurity silicon layer 108. Boron is preferably added with an ion doping apparatus in which ions generated from a source gas which is $B_2H_6$ or $BF_3$ are accelerated by voltage without mass separation and thus generated ion flow is delivered to the substrate. Note that hydrogen and/or a rare gas may be added to the source gas for adding an impurity element imparting one conductivity type. In that case, for example, $B_2H_6$ or $BF_3$ to which hydrogen or helium is added may be used as a source gas. When an ion doping apparatus is used, the area to be irradiated with the ion beam can be enlarged and the process can be performed efficiently even when the area of the single crystal silicon substrate 101 exceeds 300 mm diagonally. For example, a linear ion beam whose long side has a length of more than 300 mm is formed and delivered to the single crystal silicon substrate 101 from one end to the other end; thus, the first impurity silicon layer 108 can be formed uniformly along the entire surface of the single crystal silicon substrate 101. The thickness of the first silicon layer 108 is 30 nm to 150 nm, preferably 50 nm to 100 nm.

Further, the first impurity silicon layer 108 is not limited to single crystal silicon or polycrystalline silicon, and may be formed of microcrystalline silicon or amorphous silicon. For example, the first impurity silicon layer 108 can be formed by a plasma CVD method using a source gas in which a doping gas containing boron such as diborane is added to a silane-based gas. In the case of forming the first impurity silicon layer 108 by a plasma CVD method, the first impurity silicon layer 108 is formed before forming the protection layer 105 and after removing a native oxide layer and the like which is formed on the surface of the single crystal silicon substrate 101. Note that in the case of forming the first impurity silicon layer 108 of microcrystalline silicon or amorphous silicon, the first impurity silicon layer 108 is preferably formed thin in order to prevent recombination of carriers.

In the photoelectric conversion device of this embodiment mode, the first impurity silicon layer 108 is disposed on the side opposite to the light incidence side, so that a back surface field (BSF) can be formed. If the single crystal silicon substrate 101 is a p-type substrate, an additional impurity silicon layer to which an impurity element imparting p-type conductivity (the first impurity silicon layer 108 in this embodiment mode) is not necessarily formed. However, with arrangement of a higher-concentration p-type region (referred to as a $p^+$-type region) and a lower-concentration p-type region, a BSF can be formed. Here, by arrangement of the $p^+$-type first impurity silicon layer 108 and the p-type first single crystal silicon layer 110, light confinement effect can prevent recombination of carriers (electrons and holes) generated by photoexcitation, and a carrier collection efficiency can be increased. Accordingly, the photoelectric conversion efficiency of the photoelectric conversion device can be improved.

Figure 2C:
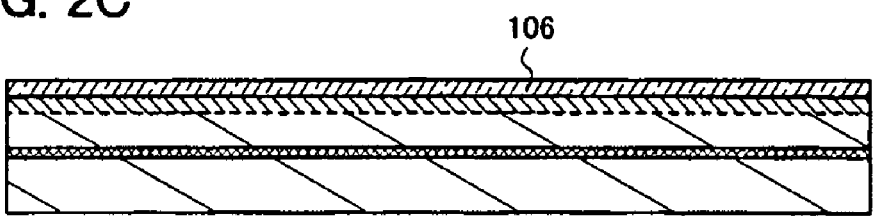

Then, after removing the protection layer 105, the first electrode 106 is formed over the first impurity silicon layer 108 (see FIG. 2C).

The first electrode 106 needs to be formed of a material which resists the temperature of heat treatment later performed for separating the single crystal silicon substrate 101; therefore, a metal with a high melting point is preferred. In specific, the first electrode 106 needs to have heat resistance to a temperature about the strain point of the supporting substrate 102. For example, a metal material such as titanium, molybdenum, tungsten, tantalum, chromium, or nickel is used. Further, a stacked structure of any of the above metal materials and a nitride thereof can be employed. For example, a stacked structure of a titanium nitride layer and a titanium layer, a stacked structure of a tantalum nitride layer and a tantalum layer, a stacked structure of a tungsten nitride layer and a tungsten layer, or the like is given. In the case of the stacked structure including nitride, the nitride is formed in contact with the first impurity silicon layer 108. By forming nitride, adhesion between the first electrode 106 and the first impurity silicon layer 108 can be improved. A surface of the first electrode 106 preferably has an average surface roughness Ra of 0.5 nm or less, preferably 0.3 nm or less. Needless to say, the smaller the average surface roughness Ra is, the more preferable it is. When the surface of the first electrode 106 has excellent smoothness, the first electrode 106 and the supporting substrate 102 can be attached in a favorable manner. Needless to say, a bonding plane with excellent smoothness can be formed by forming the insulating layer 104 serving as a bonding layer over the first electrode 106, but the smoothness of the insulating layer 104 can be easily improved if the first electrode 106 under the insulating layer 104 has excellent smoothness. Further, in some cases, if the first electrode 106 under the insulating layer 104 has excellent smoothness, the first electrode 106 and the supporting substrate can be directly bonded to each other without the insulating layer serving as a bonding layer. In specific, titanium is preferably used for forming the first electrode 106 because the smoothness of the first electrode 106 can be improved if titanium is used. The first electrode 106 is formed by a vapor deposition method or a sputtering method with a thickness of 100 nm or more. Note that if a native oxide layer and the like is formed over the first impurity silicon layer 108, the native oxide layer and the like is removed before forming the first electrode 106.

Figure 2D:
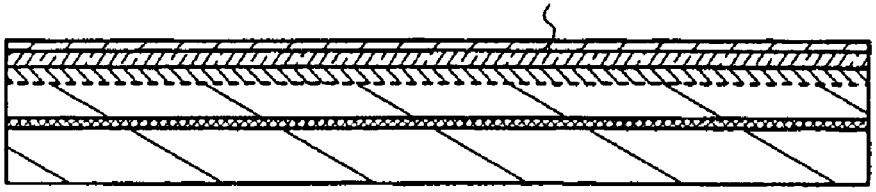

The insulating layer 104 is formed over the first electrode 106 (see FIG. 2D). The insulating layer 104 may have a single-layer structure or a stacked structure of two or more layers; in any case, the outermost surface (a bonding plane) of the insulating layer 104 is preferably smooth, more preferably smooth and hydrophilic. In specific, if the outermost surface (the bonding layer) of the insulating layer 104 has an average surface roughness Ra of 0.5 nm or less, preferably 0.3 nm or less, the insulating layer 104 and the supporting substrate can be attached in a favorable manner. Needless to say, the smaller the average surface roughness Ra is, the more preferable it is. For example, as the insulating layer 104, a silicon oxide layer, a silicon nitride layer, a silicon oxynitride layer, or a silicon nitride oxide layer is formed. As a method for forming the insulating layer 104, a CVD method such as a plasma CVD method, a photo CVD method, or a thermal CVD method (which includes a low pressure CVD method and an atmospheric pressure CVD method in its category) may be employed. A plasma CVD method is preferred because a layer with excellent smoothness can be formed by a plasma CVD method.

As for the layer having a surface which is smooth and can form a hydrophilic surface, for example, a silicon oxide layer formed by a plasma CVD method using organosilane-based gas as a source gas for forming a film is preferable. The bonding between the supporting substrate and the unit cell which is formed later can be strengthened if such a silicon oxide layer is used. As an organosilane-based gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or tris(dimethylamino)silane (chemical formula: $SiH(N(CH_3)_2)_3$) can be used.

Further, for the layer having a surface which is smooth and can form a hydrophilic surface, a layer of silicon oxide, silicon oxynitride, silicon nitride, or silicon nitride oxide which is formed by a plasma CVD method using a silane-based gas such as silane, disilane, or trisilane as a source gas for forming a film can be used. For example, a silicon nitride layer formed by a plasma CVD method using silane and ammonia for a source gas for forming a film can be used. The source gas may further contain hydrogen. Further, a silicon nitride oxide layer can be formed by a plasma CVD method using a source gas to which dinitrogen monoxide is added in addition to silane and ammonia.

For example, the insulating layer 104 is formed using a stack of a 50-nm-thick silicon oxynitride layer, a 50-nm-thick silicon nitride oxide layer, and a 50-nm-thick silicon oxide layer. These insulating layers can be formed by a plasma CVD method. The silicon oxide layer, which forms the outermost surface and has the bonding plane, has an Ra of 0.4 nm or less, preferably 0.3 nm or less after the formation, for example, the silicon oxide layer is formed by a plasma CVD method using TEOS for a source gas. When the insulating layer 104 includes a silicon insulating layer containing nitrogen, specifically a silicon nitride layer or a silicon nitride oxide layer, diffusion of impurities from the supporting substrate 102 which is later attached can be prevented.

In any case, the insulating layer 104 is not limited to an insulating layer containing silicon, as long as the insulating layer 104 has a smooth outermost surface, specifically, the insulating layer 104 has a smooth outermost surface with an average surface roughness Ra of 0.5 nm or less, preferably 0.3 nm or less. Note that in the case where the insulating layer 104 has a stacked structure, the layers except the layer which forms the outermost surface are not limited thereto. The insulating layer 104 needs to be formed at a temperature at which hydrogen is not desorbed from the fragile layer 103 formed in the single crystal silicon substrate 101, preferably at 350° C. or less.

Figure 2E:
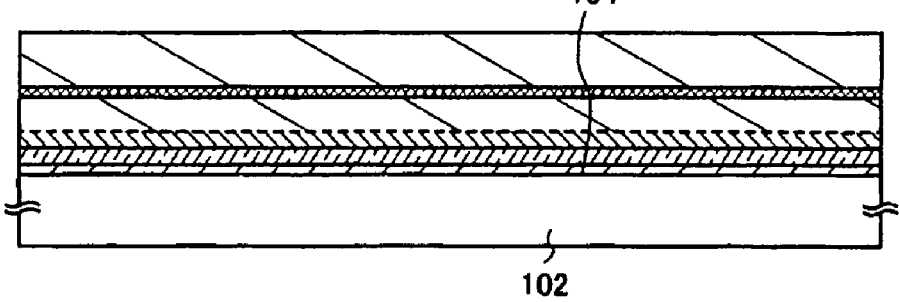

The supporting substrate 102 and the single crystal silicon substrate 101 are disposed so that one surface of the supporting substrate 102 and the one surface of the single crystal silicon substrate 101 face each other, and bonding planes are bonded (see FIG. 2E). In this embodiment mode, the insulating layer 104 formed over the single crystal silicon substrate 101 and the one surface of the supporting substrate 102 are disposed in contact with each other and bonded. The bonding planes correspond to one surface of the insulating layer 104 (the surface which is not in contact with the first electrode 106) and the one surface of the supporting substrate 102.

The bonding planes (in this embodiment mode, the one surface of the insulating layer 104 and the one surface of the supporting substrate 102) should be cleaned sufficiently in advance. This is because a bonding defect may be caused if there are particles such as microscopic dust on the bonding planes. In specific, each of the bonding planes is preferably washed and cleaned. For example, the bonding planes are cleaned by ultrasonic cleaning using pure water and ultrasonic wave with a frequency of 100 kHz to 2 MHz, megasonic cleaning, or two fluid cleaning with pure water, nitrogen, and dry air. Further, carbon dioxide or the like may be added to pure water which is used for the cleaning so that the resistivity is reduced to be 5 MΩcm or less to prevent generation of static electricity.

The bonding plane of the single crystal silicon substrate 101 and the bonding plane of the supporting substrate 102 are disposed in contact with each other and bonded. In this embodiment mode, the one surface of the insulating layer 104 and the one surface of the supporting substrate 102 are disposed in contact with each other and bonded. The bonding is formed by van der Waals forces or hydrogen bonding. For example, the single crystal silicon substrate 101 and the supporting substrate 102 which are superimposed are pressed in one place, whereby van der Waals forces or hydrogen bonding can be spread over the entire area of the bonding planes. When one or both of the bonding planes have hydrophilic surfaces, hydroxyl groups or water molecules serve as an adhesive and water molecules diffuse in later heat treatment, then the remaining composition forms silanol groups (Si—OH) and the bonding is formed by hydrogen bonding. Further, this bonding portion forms a siloxane bonding (O—Si—O) by release of hydrogen to form a covalent bond, whereby the bonding can be further strengthened. As for the bonding planes, each of the bonding planes (the one surface of the insulating layer 104 and the one surface of the supporting substrate 102) of the two substrates (the single crystal silicon substrate 101 and the supporting substrate 102) has an average surface roughness Ra of 0.5 nm or less, preferably 0.3 nm or less. Further, the sum of the average surface roughness Ra of the bonding planes of the two substrates is preferably 0.7 nm or less, more preferably 0.6 nm or less, further more preferably 0.4 nm or less. Further, contact angles of each of the bonding planes of the two substrates against pure water is preferably 20° or less, more preferably 10° or less, further more preferably 5° or less. In addition, the sum of the contact angles of the bonding planes of the two substrates against pure water is preferably 30° or less, more preferably 20° or less, further more preferably 10° or less. If the bonding planes are attached under the above conditions, they are attached in a favorable manner, whereby the bonding can be further strengthened.

In order to attach the supporting substrate 102 and the single crystal silicon substrate 101 in a favorable manner, the bonding planes may be activated in advance. For example, one or both of the bonding planes are irradiated with an atomic beam or an ion beam. As the atomic beam or the ion beam, an inert gas neutral atom beam or inert gas ion beam of argon or the like can be used. It is also possible to activate the bonding plane by plasma treatment or radical treatment. Such surface treatment facilitates bonding between different kinds of materials even at a temperature of 400° C. or less. Alternatively, the bonding plane may be cleaned with ozone-containing water, oxygen-containing water, hydrogen-containing water, pure water, or the like. Such cleaning treatment can make the bonding plane hydrophilic and increase the number of hydroxyl groups at the bonding plane, whereby the bonding can be further strengthened.

After bonding the single crystal silicon substrate 101 and the supporting substrate 102 to each other, heat treatment or pressure treatment is preferably performed. Heat treatment or pressure treatment can increase the bonding strength. If heat treatment is performed, the temperature of the heat treatment is set at a temperature that is lower than or equal to the strain point of the supporting substrate 102 and at which the volume change does not occur in the fragile layer 103 formed in the single crystal silicon substrate 101. The temperature is preferably 200° C. or more and less than 410° C. Note that this heat treatment and another heat treatment which is performed later for separating a part of the single crystal silicon substrate 101 along the fragile layer 103 may be successively performed. Further, in an apparatus or a place where the substrates are attached, heat treatment at 200° C. or more may be successively performed to strengthen the bond. If pressure treatment is performed, pressure is applied in a direction perpendicular to the bonding planes in consideration of pressure resistance of the supporting substrate 102 and the single crystal silicon substrate 101.

Note that the supporting substrate 102 may be provided with an insulating layer, and the insulating layer over the supporting substrate 102 may be the bonding plane. Further, the supporting substrate 102 may be provided with a silicon insulating layer containing nitrogen such as a silicon nitride layer or a silicon nitride oxide layer. A silicon insulating layer containing nitrogen can serve as a blocking layer which prevents contamination due to impurities from the supporting substrate 102.

Heat treatment is performed to separate part of the single crystal silicon substrate 101 from the supporting substrate 102 along the fragile layer 103 or the vicinity of the fragile layer 103. The first single crystal silicon layer 110 separated from the single crystal silicon substrate 101 remains over the supporting substrate 102, and thus a so-called SOI structure is obtained. The first single crystal silicon layer 110 has the same or substantially the same crystallinity as the single crystal silicon substrate 101. Moreover, a separation substrate 130 from which the first single crystal silicon layer 110 has been separated is obtained (see FIG. 3A).

The heat treatment for separating the first single crystal silicon layer 110 from the single crystal silicon substrate 101 along the fragile layer 103 is preferably performed at 410° C. or more and less than the strain point of the supporting substrate 102. In addition, the heat treatment is preferably performed at equal to or higher than the temperature at which the insulating layer 104 is formed. When the heat treatment is performed at 600° C. or more, preferably 630° C. or more and less than the strain point of the supporting substrate 102, an impurity element contained in the first impurity silicon layer 108 can be activated without the supporting substrate 102 being warped. For example, when the heat treatment is performed at 450° C. or more and less than 700° C., the minute voids formed in the fragile layer 103 change in volume, whereby separation occurs along the fragile layer 103. Since the insulating layer 104 is bonded to the supporting substrate 102, the first single crystal silicon layer 110 is formed over the supporting substrate 102. The thickness of the first single crystal silicon layer 110 substantially corresponds to the depth at which the fragile layer 103 is formed. In addition, the insulating layer 104, the first electrode 106, and the first impurity silicon layer 108 are formed between the supporting substrate 102 and the first single crystal silicon layer 110.

Note that the separation plane of the first single crystal silicon layer 110 remains uneven with an average surface roughness (Ra) of 7 nm to 10 nm and a peak-to-valley height (PV) of 300 nm to 400 nm, in some cases. Note that the peak-to-valley height refers to the largest difference in height between the peak and the valley. The peak and the valley herein used indicate the peak and the valley obtained by three-dimensionally expanding the peak and the valley defined by JISB0601. The peak can be expressed as the highest point in the specific plane and the valley can be expressed as the lowest point in the plane surface. The unevenness of the surface of the first single crystal silicon layer 110 can have an influence on a layer formed thereover; accordingly, the top layer (in this embodiment mode, the second impurity silicon layer), which is a light incidence plane of the photoelectric conversion device to be completed, can have unevenness. It is said that a semiconductor surface generally has a reflectance of 30% to 50%, though depending on wavelength. The reflection at the light incidence plane leads to loss of incident light, which is a factor of decrease in photoelectric conversion efficiency. If unevenness is formed on the light incidence plane, reflectance can be reduced by the texture of the surface, and a photoelectric conversion efficiency can be improved by a light trapping effect.

The separation substrate 130, which is the single crystal silicon substrate from which the first single crystal silicon layer 110 is separated can be reused after reprocessing treatment. The separation substrate 130 may be reused as a single crystal silicon substrate for forming a photoelectric conversion device, or may be used for another purpose. If the separation substrate 130 is reused as a single crystal silicon substrate from which a single crystal silicon layer is separated, a plurality of photoelectric conversion devices can be manufactured with one substrate. The thinner the separated first single crystal silicon layer 110 is, the thicker the separation substrate 130 can be and the number of reuse of the substrate can be increased, which leads to effective use of resources.

Crystal defects may be generated in the first single crystal silicon layer 110, which is a thin slice separated from the single crystal silicon substrate 101, due to damage caused by a process for forming the fragile layer and the separation process. Defects in a region conducting photoelectric conversion may cause decrease in photoelectric conversion efficiency. For example, the defects serve as a recombination center or may trap carriers. Further, since the first single crystal silicon layer 110 is a seed layer for epitaxial growth, epitaxial growth does not progress well if the region has crystal defects. Therefore, crystal defect repair treatment or crystal defect elimination treatment is performed on the single crystal silicon layer which is obtained by separating a thin slice from the single crystal silicon substrate.

As crystal defect repair treatment or crystal defect elimination treatment, laser irradiation, rapid thermal anneal (RTA) treatment, flash lamp treatment, heat treatment in a furnace, etching treatment, or CMP treatment may be employed. In this embodiment mode, an example in which crystal defects are reduced by laser treatment is described (see FIG. 3B).

The first single crystal silicon layer 110 is irradiated with a laser beam to be melted partially or completely and recrystallized. Thus, crystal defects in the first single crystal silicon layer 110 can be repaired. It is preferable that the single crystal silicon layer be melted partially by irradiation with a laser beam. If the single crystal silicon layer is completely melted, there is a possibility that the crystallinity of the single crystal silicon layer is lowered by microcrystallization due to disordered nucleation in the single crystal silicon layer in a liquid phase. On the other hand, in the case where the single crystal silicon layer is partially melted, crystals are grown from a solid phase portion which is not melted; accordingly, crystal defects can be repaired without the crystallinity being lowered. Note that in this specification, complete melting means that the single crystal silicon layer is melted to the vicinity of the lower interface to be made in a liquid phase; partial melting means that a part (e.g., an upper part) of the single crystal silicon layer is melted to be made in a liquid phase whereas another part (e.g., a lower part) is kept in a solid phase without being melted.

Figure 3A:
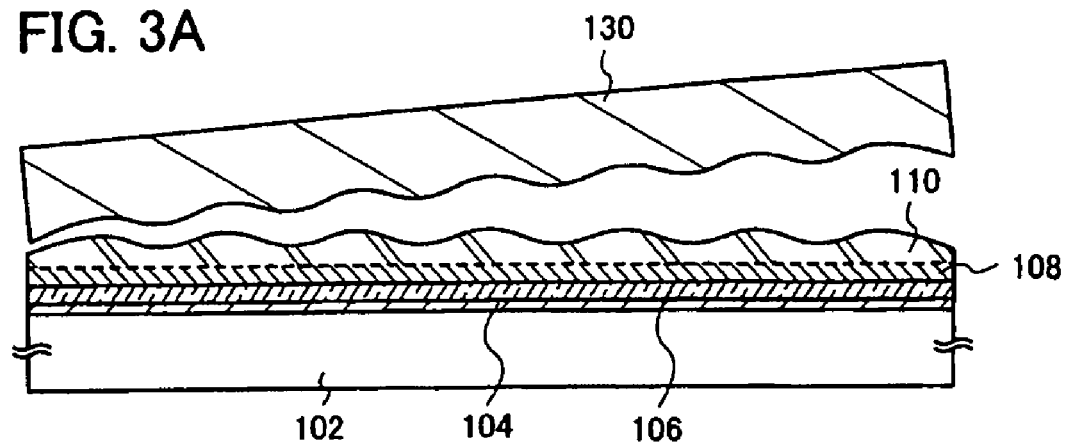
FIGS. 3A to 3C are cross-sectional views illustrating an example of a method for manufacturing a photoelectric conversion device according to an aspect of the present invention.
Figure 3B:
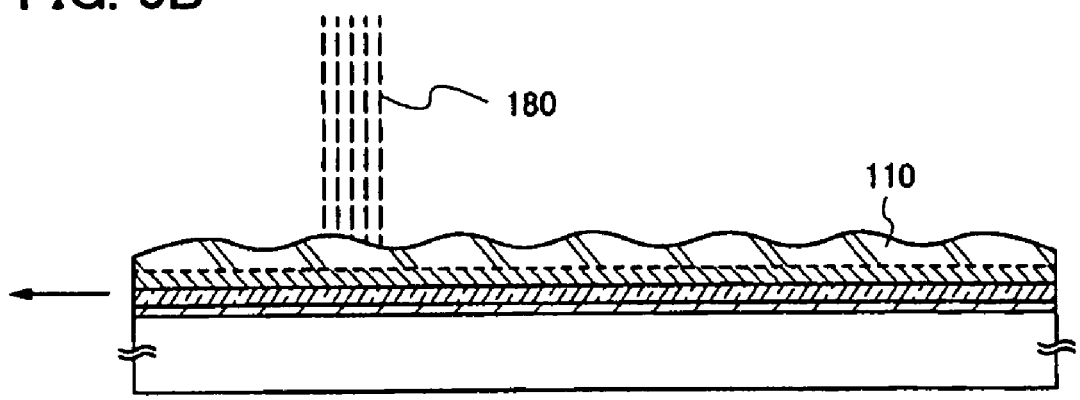

For example, as illustrated in FIG. 3B, by irradiating the top surface of the first single crystal silicon layer 110 with a laser beam 180, at least the surface side of the first single crystal silicon layer 110 is melted, and with a lower layer part which is in a solid phase serving as a seed layer, the first single crystal silicon layer 110 is recrystallized in a later cooling process. Crystal defects in the first single crystal silicon layer 110 can be repaired through the process. As the laser beam 180, for example, a beam emitted from an XeCl excimer laser or a second harmonic of a YAG laser is preferably used.

Here, in the case of repairing crystal defects by using light such as a laser beam with a wavelength in the ultraviolet region, the thickness of the first single crystal silicon layer 110 is preferably small, specifically the thickness is preferably 200 nm or less, more preferably 100 nm or less. This is because when the thickness of the single crystal silicon layer whose crystal defects are repaired is small, energy required for repairing crystal defects can be small.

As a method for reducing crystal defects in the first single crystal silicon layer 110, laser treatment is preferable because it does not directly heat the supporting substrate 102 and increase in temperature of the supporting substrate 102 can be suppressed. In particular, in the case where a glass substrate with low heat resistance is used as the supporting substrate 102, crystal defects are repaired preferably through laser treatment. Further, by forming the first single crystal silicon layer 110 having a small thickness, crystal defects can be sufficiently repaired through laser treatment. This is because if the first single crystal silicon layer 110 is too thick, the first single crystal silicon layer 110 cannot be sufficiently melted in a deep region in the thickness direction, and many crystal defects may remain in a region which serves as the seed layer.

It is preferable that at least a region which is to be irradiated with the laser beam be heated up to 250° C. to 600° C. during the above laser treatment. When the region which is irradiated is heated, a melting time by irradiation with the laser beam can be increased and defects can be repaired effectively. Although the laser beam 180 melts the surface side of the first single crystal silicon layer 110, the supporting substrate 102 is hardly heated; therefore, a substrate with low heat resistance such as a glass substrate can be used as the supporting substrate. In addition, if the first electrode 106 is formed of a metal with a high melting point, no adverse effect is given to the first single crystal silicon layer 110 even when heating is performed at the above temperature. Silicide is formed at the interface between the first impurity silicon layer 108 and the metal that forms the first electrode 106, whereby current flows more easily. In addition, activation of the first impurity silicon layer 108 can also be performed by the above laser treatment.

Further, by irradiating the top surface of the first single crystal silicon layer 110 with a laser beam in an atmosphere containing oxygen, it is possible to form unevenness on the surface of the first single crystal silicon layer 110 or to increase the peak-to-valley height of unevenness which has been already formed on the surface which is the separation plane.

Figure 7:
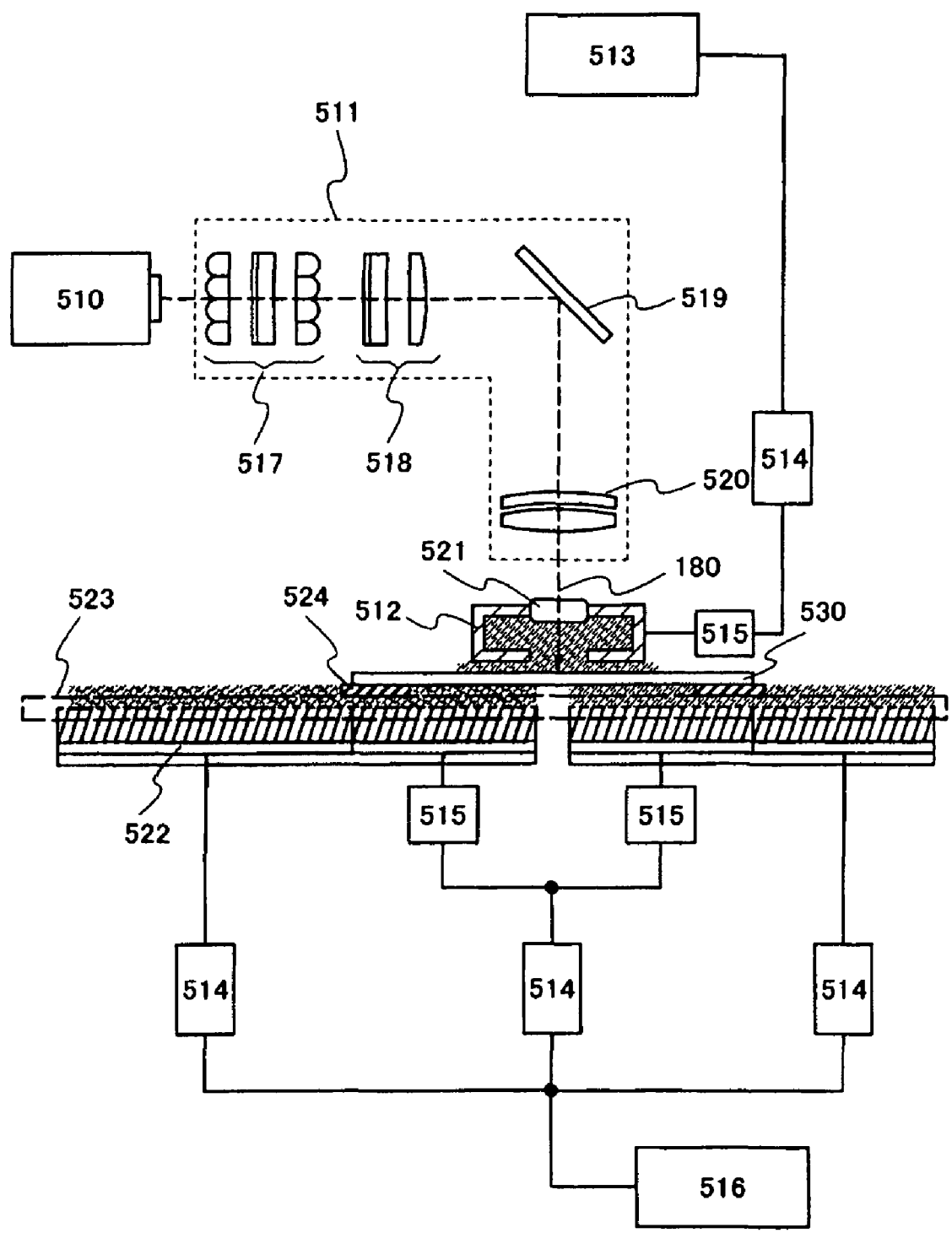
FIG. 7 is a conceptual diagram illustrating a structure of a laser treatment apparatus which can be applied to the present invention.

An example of a laser treatment apparatus which can perform the laser treatment for reducing crystal defects is described with reference to FIG. 7. The laser treatment apparatus is provided with a laser 510, an optical system 511 by which a laser beam is converged and extended into a narrow linear beam, a gas jet pipe 512 which controls an atmosphere around a region which is irradiated with the laser beam, a gas supply portion 513 which supplies an atmosphere control gas to the gas jet pipe 512, a mass flow control portion 514, a gas heat portion 515, a substrate stage 522 which floats and transports an object 530 to be irradiated (specifically, the supporting substrate 102 to which the first single crystal silicon layer 110 is fixed), a guide rail 523 which supports opposite ends of the substrate and transports the object 530 to be irradiated, and a gas supply portion 516 which supplies a gas for floating to the substrate stage 522.

As the laser 510, a laser whose emission wavelength is in the range from the ultraviolet light region to the visible light region is selected. The laser 510 is preferably a pulsed ArF, KrF, or XeCl excimer laser; or a pulsed solid state laser such as an Nd-YAG laser or a YLF laser which emits a laser beam with a repetition rate of 1 MHz or less and the pulse width of 10 ns or more and 500 ns or less. For example, a XeCl excimer laser which can emit a laser beam with a repetition rate of 10 Hz to 300 Hz, a pulse width of 25 ns, and a wavelength of 308 nm is used.

The optical system 511 converges and extends the laser beam to form a laser beam which has a linear cross section on the surface to be irradiated. The optical system 511 which forms a linear beam includes a cylindrical lens array 517, a cylindrical lens 518, a mirror 519, and a doublet cylindrical lens 520. Although depending on the size of the lenses, a linear laser beam with a length of about 100 mm to 700 mm in a long-side direction and about 100 μm to 500 μm in a short-side direction can be delivered.

The object 530 to be irradiated is irradiated with the laser beam converged into a linear shape, through a light introducing window 521 of the gas jet pipe 512. The gas jet pipe 512 is disposed adjacent to the object 530 to be irradiated. A nitrogen gas is supplied to the gas jet pipe 512 from the gas supply portion 513. The nitrogen gas is jetted from an opening of the gas jet pipe 512 that faces the object 530 to be irradiated. The opening of the gas jet pipe 512 is disposed in accordance with an optical axis of the linear laser beam so that the first single crystal silicon layer 110 fixed over the supporting substrate 102, which is the object 530 to be irradiated, is irradiated with the laser beam 180 that is introduced through the light introducing window 521. By the nitrogen gas jetted through the opening of the gas jet pipe 512, the region which is irradiated with the laser beam can have a nitrogen atmosphere.

The nitrogen gas supplied to the gas jet pipe 512 is heated up to 250° C. to 600° C. by the gas heating portion 515, whereby the temperature of the surface of the object 530 to be irradiated which is irradiated with the laser beam can be controlled using the heated nitrogen gas. When the region which is irradiated is heated, the melting time by the irradiation with the laser beam can be controlled as described above.

Air or nitrogen from the gas supply portion 516 is supplied to the substrate stage 522 through the mass flow control portion 514. The gas supplied from the gas supply portion 516 is jetted in a direction from the top surface of the substrate stage 522 to the bottom surface of the supporting substrate 102 of the object 530 to be irradiated, thereby floating the supporting substrate 102. The object 530 to be irradiated is transported in such a manner that opposite ends thereof are mounted on sliders 524 that move along the guide rail 523, and the object 530 to be irradiated is sprayed with a gas from the substrate stage 522 side so that the object 530 to be irradiated can be transported while being floated without being bent. In the laser treatment apparatus of this embodiment mode, a nitrogen gas is jetted from the gas jet pipe 512 to the top surface of the supporting substrate 102 of the object 530 to be irradiated and the back surface of the supporting substrate 102 is also sprayed with a gas. Therefore, the supporting substrate 102 can be prevented from being deformed.

The substrate stage 522 may be divided into a portion irradiated with the laser and its vicinity, and a region other than those. The portion to be irradiated with the laser and its vicinity of the substrate stage 522 may be sprayed with a nitrogen gas heated by the gas heating portion 515, whereby the supporting substrate 102 of the object 530 to be irradiated can be heated.

As an alternative to laser treatment, crystal defects can be repaired with RTA treatment, flash lamp irradiation, or heat treatment using a furnace. RTA treatment or flash lamp irradiation is preferably employed because treatment can be performed at higher temperature than in the case of using a furnace. In RTA treatment, rapid heating is performed, and energy is directly given to an object so that the inside of the chamber and the object can be heated under a thermal non-equilibrium state. Accordingly, heat treatment can be performed at a temperature which is somewhat higher than a strain point of the object without the object being warped. As an RTA apparatus, a lamp rapid thermal anneal (LRTA) apparatus employing a lamp heating method, a gas rapid thermal anneal (GRTA) apparatus employing a gas heating method using a heated gas, an RTA apparatus employing both a lamp heating method and a gas heating method, and the like can be given. An RTA apparatus can employ a lamp such as a halogen lamp, a metal halide lamp, a xenon arc lamp, a carbon arc lamp, a high pressure sodium lamp, or a high pressure mercury lamp. Further, RTA treatment can be performed in an atmosphere to which an inert gas like nitrogen or a rare gas such as argon which does not react with the object is added. Further, in addition to a lamp, a heater such as a resistance heater may be used.

Figure 3C:
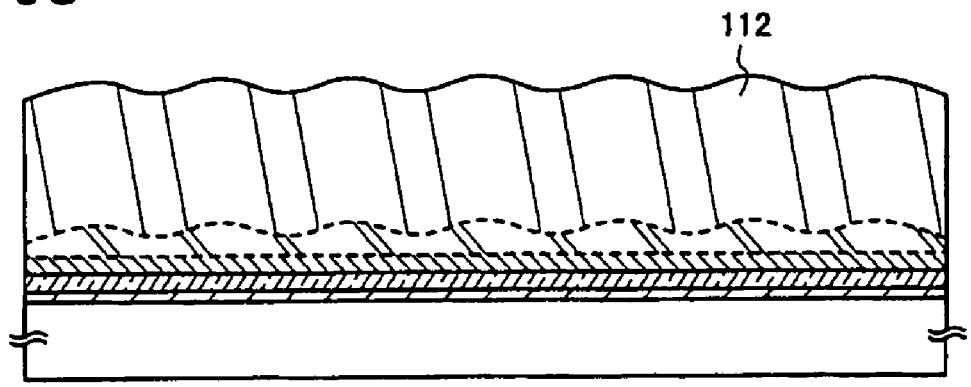

The second single crystal silicon layer 112 is grown epitaxially on the first single crystal silicon layer 110 (see FIG. 3C). The second single crystal silicon layer 112 can be obtained by forming a silicon layer over the first single crystal silicon layer 110 and at the same time epitaxially growing (vapor phase growing) the silicon layer using the first single crystal silicon layer 110 as a seed layer by an atmospheric pressure plasma CVD method.

In specific, a source gas containing a silane-based gas is activated by plasma generated at atmospheric pressure or near atmospheric pressure, and a silicon layer is formed at the same time as epitaxial growth is conducted using the single crystal silicon layer thereunder as a seed layer.

The pressure is set to atmospheric pressure or near atmospheric pressure at a surface where a film is formed. In this embodiment mode, a surface which is a separation plane of the first single crystal silicon layer 110 corresponds to the surface where a film is formed. Note that in this specification, atmospheric pressure or near atmospheric pressure refers to 0.1 atm to 10 atm or about $10^4$ Pa to $10^6$ Pa, preferably 0.2 atm to 2 atm, and typically about $10^5$ Pa. If it is difficult to control or measure the pressure at the surface where a film is formed, the pressure in a chamber is set within the above range.

By generating plasma at atmospheric pressure or near atmospheric pressure, a plasma density can be high compared with plasma in general plasma CVD. Thus, a film can be epitaxially grown at high speed.

A source gas at least contains a silane-based gas. In addition, a rare gas such as argon or helium is preferably added to the source gas. Further, hydrogen can be added to the source gas. By using such a source gas, the second single crystal silicon layer 112, which is an i-type semiconductor, can be formed.

Further, as a source gas, a doping gas may be added to a silane-based gas to form the second single crystal silicon layer 112 having one conductivity type, p-type or n-type. Further, in the case of adding a doping gas, a rare gas or hydrogen may be added. Note that in the case where the p-type or n-type second single crystal silicon layer 112 is formed, the concentration of an impurity is preferably lower than that of the first single crystal silicon layer 110 and the second impurity silicon layer 114 which is formed later.

For example, plasma is generated by applying a high electric power frequency of 13.56 MHz, 27 MHz, 60 MHz, or 150 MHz at atmospheric pressure or near atmospheric pressure and the silicon layer is epitaxially grown. A temperature of the substrate is in the range of 550° C. to 670° C. Further, silane can be used as a source gas and helium or hydrogen can be added thereto. If the temperature of the substrate is 600° C. or more, a growth rate can be 1 μm/min and a layer with a thickness of 1 μm to 20 μm can be epitaxially grown.

Note that in the case where a material layer or the like which is not single crystal silicon, such as a native oxide layer is formed on the surface of the first single crystal silicon layer 110, epitaxial growth is conducted after the material layer or the like is removed. This is because if the material layer which is not single crystal silicon is formed on the single crystal silicon layer, epitaxial growth does not progress well. A native oxide layer can be removed with, for example, hydrofluoric acid. In specific, the surface of the first single crystal silicon layer 110 is treated with hydrofluoric acid until the surface shows a water repellent property. The removal of the oxide layer from the surface of the first single crystal silicon layer 110 can be confirmed by a water repellent property. Further, in conducting epitaxial growth, a native oxide layer or atmospheric elements (oxygen, nitrogen, or carbon) at the surface of the first single crystal silicon layer 110 can be removed through plasma treatment with a mixed gas of hydrogen and a rare gas, for example, a mixed gas of hydrogen and helium or a mixed gas of hydrogen, helium, and argon before a silane-based gas such as silane is added.

In the present invention, crystal defect repair treatment or crystal defect elimination treatment is performed before conducting epitaxial growth so that crystal defects in the single crystal silicon layer which serves as a seed layer is reduced, thus a thickness of a preferable single crystal silicon layer can be increased. If there are crystal defects, they become recombination centers of carriers generated by photoexcitation and reduce a carrier collection efficiency. According to the present invention, a cause of decrease in photoelectric conversion efficiency can be reduced.

In addition, according to the present invention, a single crystal silicon layer which serves as a seed layer can be thin and the thickness of the single crystal silicon layer can be increased by epitaxial growth. The amount of silicon which is a raw material can be reduced, whereby consumption of resources can be reduced. Further, in the case of separating a thin superficial single crystal silicon layer from a single crystal silicon substrate by a conventional hydrogen ion implantation separation method, the ion implantation layer has needed to be formed at deep region in the thickness direction of the single crystal silicon substrate by increasing acceleration voltage in order to make the single crystal silicon layer which is separated be thick. There has been a limit of present ion implantation apparatus or ion doping apparatus to increase in acceleration voltage; accordingly, there has been an upper limit of the thickness of the single crystal silicon layer which is separated. However, by conducting epitaxial growth by an atmospheric pressure plasma CVD method as in the present invention, a film can be formed at high speed and a thick single crystal silicon layer can be easily obtained. Further, as described above, by conducting epitaxial growth after treatment for reducing crystal defects, a thickness of a preferable single crystal silicon layer can be increased. By employing a structure in which photoelectric conversion is conducted by thus thickened single crystal silicon layer, a photoelectric conversion device with an excellent photoelectric conversion characteristic can be manufactured.

As described thus far, the single crystal silicon layer 113 in which the second single crystal silicon layer 112 is epitaxially grown on the first single crystal silicon layer 110 can be obtained. By having a thickness of 1 μm to 20 μm, preferably 1 μm to 10 μm, the single crystal silicon layer 113 can sufficiently absorb sunlight. Thus, a photoelectric conversion efficiency is improved. The thickness of the first single crystal silicon layer 110 and the second single crystal silicon layer 112 may be determined in consideration of productivity such as a cycle time or cost. For example, the thickness of the first single crystal silicon layer 110 is 20 nm to 1000 nm, preferably 40 nm to 300 nm, and the thickness of the second single crystal silicon layer 112 is 0.5 μm to 20 μm, preferably 1 μm to 10 μm.

Figure 4A:
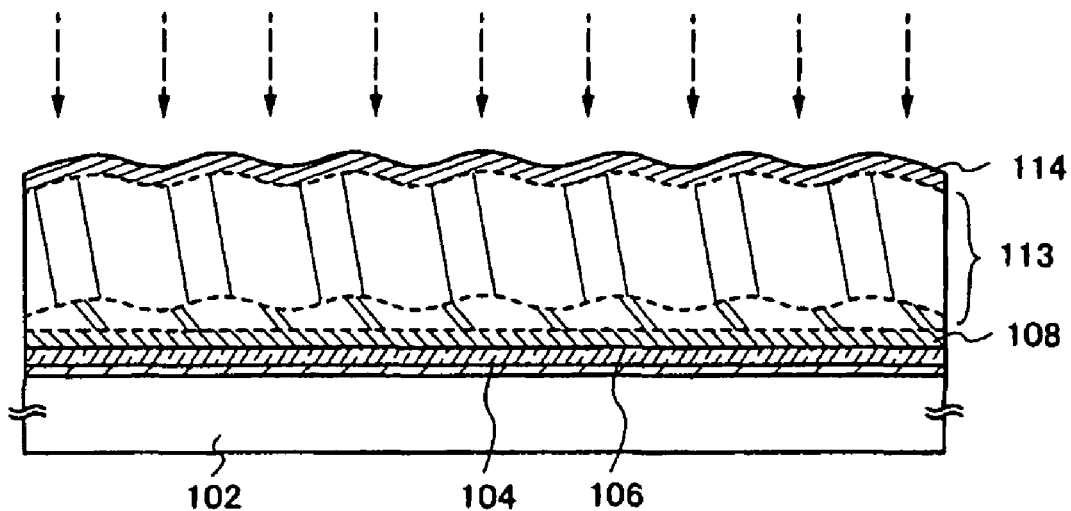
FIGS. 4A to 4C are cross-sectional views illustrating an example of a method for manufacturing a photoelectric conversion device according to an aspect of the present invention.

An impurity element imparting an opposite conductivity type to the first impurity silicon layer 108 is added to one surface side of the single crystal silicon layer 113 (the surface which is opposite from the first impurity silicon layer 108), whereby the second impurity silicon layer 114 is formed (see FIG. 4A).

For example, since an example in which boron is added to the first impurity silicon layer 108 to form the p-type first impurity silicon layer 108 is illustrated in FIG. 2B, phosphorus or arsenic is added as an impurity element imparting an opposite conductivity type to the first impurity silicon layer 108 to form the n-type second impurity silicon layer 114. The impurity element may be added by an ion implantation method or an ion doping method. For example, the second impurity silicon layer 114 is formed with a thickness of 50 nm to 100 nm. Note that after forming the second impurity silicon layer 114, RTA treatment or laser treatment is preferably conducted to activate an impurity element contained in the second impurity silicon layer 114.

Further, the second impurity silicon layer 114 is not limited to single crystal silicon or polycrystalline silicon, and may be formed of microcrystalline silicon or amorphous silicon. For example, the second impurity silicon layer 114 can be formed by a plasma CVD method using a source gas in which a doping gas containing phosphorus such as phosphine is added to a silane-based gas. Note that in the case where the second impurity silicon layer 114 is formed by a plasma CVD method or the like, the second impurity silicon layer 114 is formed after removing a native oxide layer or the like which is formed over the single crystal silicon layer 113. Note that in the case of forming the second impurity silicon layer 114 of microcrystalline silicon or amorphous silicon, the second impurity silicon layer 114 is preferably formed thin in order to prevent recombination of carriers.

Note that in the case where the second single crystal silicon layer 112 has an opposite conductivity type to the first impurity silicon layer 108, the second impurity silicon layer 114 is not necessarily provided. However, by providing the second impurity silicon layer 114 with a higher concentration of an impurity than the second single crystal silicon layer 112, a carrier collection efficiency can be improved.

Alternatively, the second impurity silicon layer 114 can be formed by forming an impurity silicon layer and at the same time epitaxially growing the impurity silicon layer by an atmospheric pressure plasma CVD method using a source gas in which a doping gas is mixed into a silane-based gas.

As described thus far, the unit cell 116 in which the first impurity silicon layer 108 having one conductivity type, the single crystal silicon layer 113, and the second impurity silicon layer 114 having a conductivity type opposite to the one conductivity type are stacked in that order can be obtained.

Note that in some cases, unevenness is formed on a surface of the unit cell 116, a surface of the second impurity silicon layer 114 here. Such unevenness is formed under influence of the unevenness of a surface which is the separation plane of the first single crystal silicon layer 110, which is a thin superficial layer of the single crystal silicon substrate separated therefrom. In this embodiment mode, the surface of the second impurity silicon layer 114 serves as a light incidence plane; therefore, the unevenness can reduce reflectance as a surface texture. Thus, a photoelectric conversion efficiency can be improved.

Figure 4B:
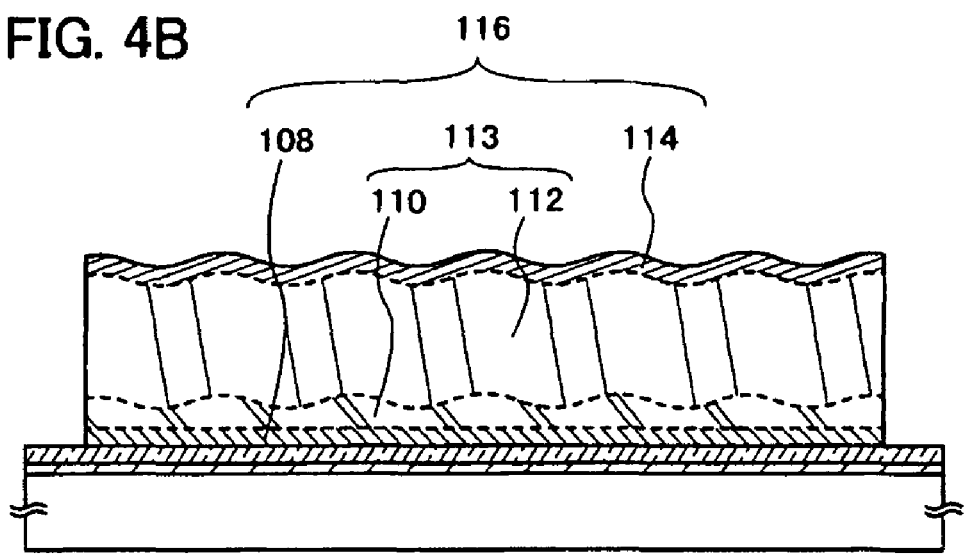
Figure 4C:
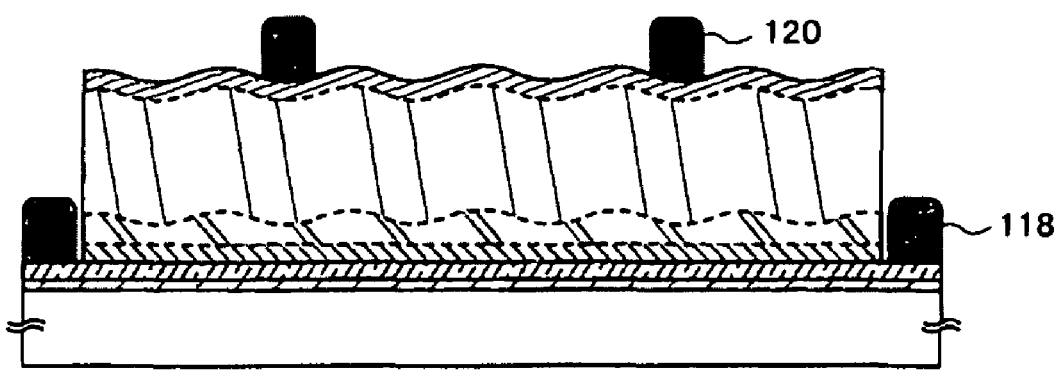

The first impurity silicon layer 108, the single crystal silicon layer 113, and the second impurity silicon layer 114 over the first electrode 106 are etched as selected to expose a part of the first electrode 106 (see FIG. 4B). Then, the second electrode 120 is formed over the second impurity silicon layer 114, and the auxiliary electrode 118 which is in contact with the first electrode 106 is formed (see FIG. 4C).

Electric energy which has been converted from light needs to be extracted from the photoelectric conversion device. The electric energy can be extracted through electrodes corresponding to a positive electrode and a negative electrode. The first electrode 106 and the second electrode 120 serves as the electrodes corresponding to a positive electrode and a negative electrode. However, from the first impurity silicon layer 108 to the second impurity silicon layer 114 are provided on the first electrode 106 and the supporting substrate 102 is provided under the first electrode 106. In this state, electricity is difficult to be extracted to the outside. Consequently, it is preferable to form the auxiliary electrode 118 which is electrically connected to the first electrode 106 and can serve as a leading electrode.

In this embodiment mode, layers which are formed over the first electrode 106 are etched as selected to expose an end portion of the first electrode 106, and the auxiliary electrode 118 is formed in contact with a part of the first electrode 106 which is exposed. In specific, a mask is formed using resist or an insulating layer such as a silicon nitride layer over the second impurity silicon layer 114, and etching may be performed using the mask to expose a part of the first electrode 106. The etching may be dry etching using a fluorine-based gas such as $NF_3$ or $SF_6$ under the condition where at least the etching selectivity between the first electrode 106 and the layers thereover (from the first impurity silicon layer 108 to the second impurity silicon layer 114) is sufficiently high. After the etching, the mask becomes unnecessary is removed.

The second electrode 120 is formed to have a grid shape (or a comb-like shape or a pectinate shape) when seen from above, as illustrated in FIG. 1A. Thus, light can enter the unit cell 116. The shape of the second electrode 120 is not particularly limited; however, it is needless to say that the area in which the second electrode 120 covers the unit cell 116 (the second impurity silicon layer 114) is preferably made as small as possible so that an effective area of a light incidence plane can be enlarged.

The auxiliary electrode 118 can be formed through the same step as the second electrode 120. In addition, the auxiliary electrode 118 can serve as an extraction electrode. Note that the auxiliary electrode 118 is not necessarily provided, and whether or not to provide the auxiliary electrode 118 and the shape thereof may be selected as appropriate by a designer. As in this embodiment mode, by forming the auxiliary electrode 118, the extraction electrode can be led freely and electric energy can be easily extracted to the outside.

The second electrode 120 and the auxiliary electrode 118 are formed by a printing method or the like using nickel, aluminum, silver, lead-tin (solder), or the like. For example, the second electrode 120 and the auxiliary electrode 118 can be formed using a nickel paste or a silver paste by a screen printing method. Note that in the case of forming the electrodes by a screen printing method using paste or the like, the thickness of each electrode can be about several micrometers to several hundreds of micrometers. Note that these electrodes are illustrated in schematic diagrams which do not necessarily illustrate the actual dimension.

As described thus far, the photoelectric conversion device 100 can be manufactured.

Figure 8:
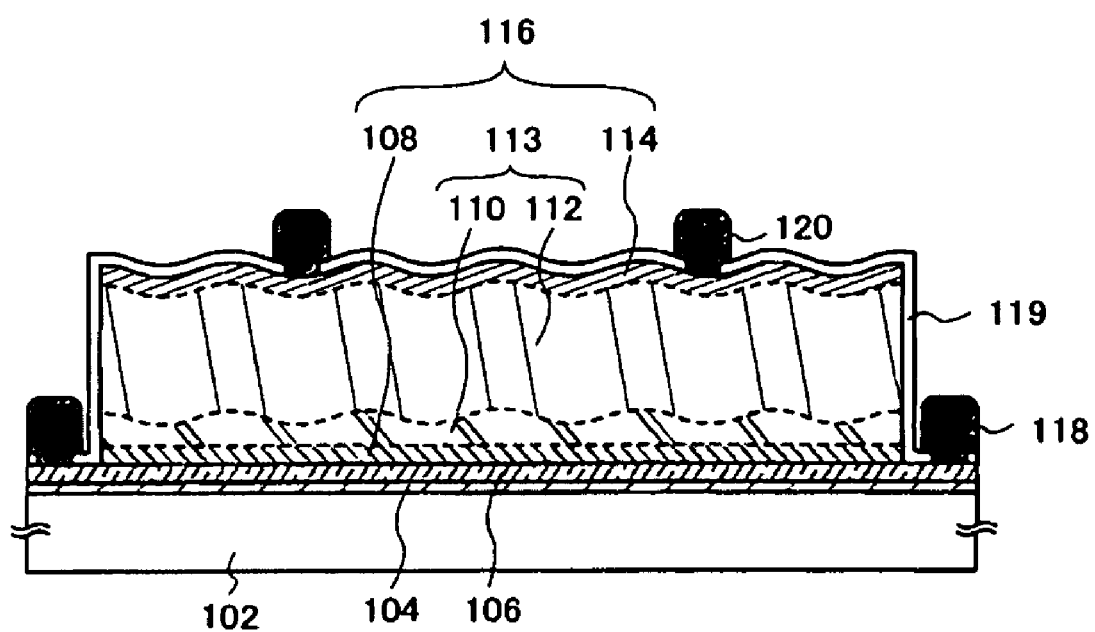
FIG. 8 is a cross-sectional view illustrating an example of a photoelectric conversion device according to an aspect of the present invention.

Note that a passivation layer 119 which also serves as an antireflection layer is preferably formed over the unit cell 116 (see FIG. 8).

As described above, the reflection at a light incidence plane leads to loss of incident light, which is a factor of decrease in photoelectric conversion efficiency. Therefore, the passivation layer 119 whose refractive index is between the refractive indices of air and silicon, which is a material of the light incidence plane of the unit cell 116, and whose transmittance does not interrupt light incidence is formed on the light incidence plane of the unit cell 116 (the top surface of the second impurity silicon layer 114 in this embodiment mode). Thus, the reflection at the incidence plane of the unit cell 116 can be prevented. As the passivation layer 119, a silicon nitride layer, a silicon nitride oxide layer, a magnesium fluoride layer, or the like can be used.

The passivation layer 119 is provided between the unit cell 116 and the second electrode 120 and between the unit cell 116 and the auxiliary electrode 118. In this case, after the passivation layer 119 is formed over the unit cell 116, the passivation layer 119 is etched to form openings so that a part of the second impurity silicon layer 114 and a part of the first electrode 106 are exposed. Alternatively, the passivation layer 119 provided with openings can be formed by a lift-off method or the like. Then, the second electrode 120 is formed by a printing method so that the second electrode 120 is in contact with the second impurity silicon layer 114 through the openings provided in the passivation layer 119. In addition, by the same steps, the auxiliary electrode 118 is formed in contact with the first electrode 106 through the openings provided in the passivation layer 119.

The photoelectric conversion device of this embodiment mode can have a favorable single crystal silicon layer with a large thickness because the single crystal silicon layer is epitaxially grown by an atmospheric pressure plasma CVD method after crystal defects therein are reduced. By forming a layer conducting photoelectric conversion with such a thick single crystal silicon layer, a photoelectric conversion efficiency can be improved. Accordingly, a photoelectric conversion device with an excellent photoelectric conversion characteristic can be manufactured. In addition, by utilizing an atmospheric pressure plasma CVD method, a film can be epitaxially grown at high speed and a thick single crystal silicon layer can be obtained without decrease in productivity compared with a case of utilizing a conventional plasma CVD method.

Further, by increasing the thickness of a single crystal silicon layer by epitaxial growth, the consumption of silicon which is a raw material can be reduced. Further, by obtaining the single crystal silicon layer by separating a superficial layer of the single crystal silicon substrate, the single crystal silicon substrate from which the layer is separated can be reused. In addition, by using $H_3^+$ ions to separate the single crystal silicon layer from the single crystal silicon substrate, the single crystal silicon layer which is thin can be easily separated. When the single crystal silicon layer which is separated is thin, the single crystal silicon substrate after the separation remains thick, whereby the number of times of reusing the substrate can be increased. Accordingly, resources can be effectively used and raw material cost can be reduced.

Figure 9:
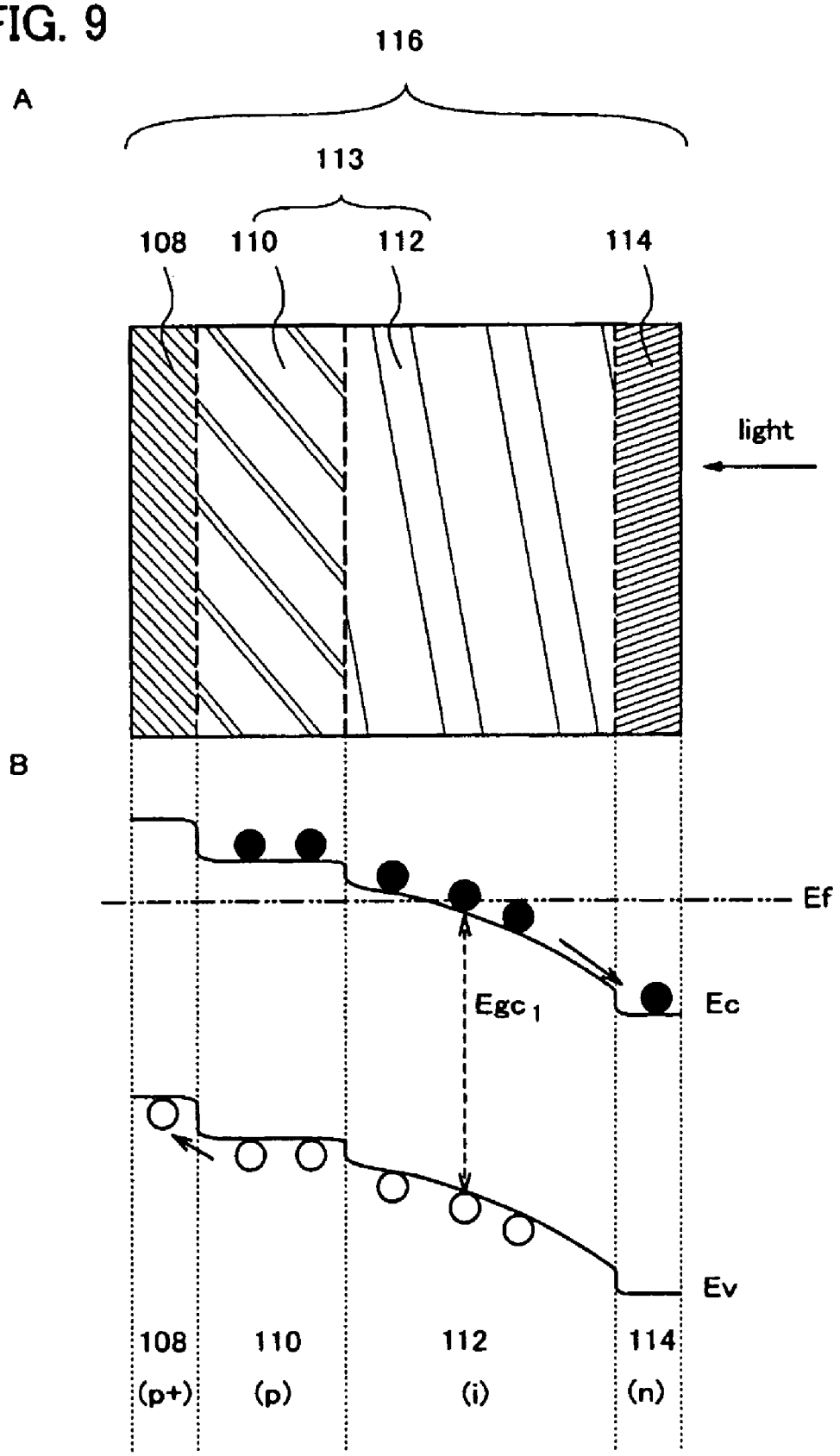
FIG. 9A is a cross-sectional view of a unit cell of a photoelectric conversion device according to an aspect of the present invention and FIG. 9B is an energy band diagram corresponding to FIG. 9A.

FIG. 9A is a cross-sectional schematic diagram illustrating an example of the unit cell 116 which is included in the photoelectric conversion device of this embodiment mode. In this unit cell 116, the $p^+$-type first impurity silicon layer 108 (a $p^+$-layer), a p-type first single crystal silicon layer 110 (a p-layer), an i-type second single crystal silicon layer 112 (an i-layer), and an n-type second impurity silicon layer 114 (an n-layer) are arranged in that order. The unit cell 116 includes a single crystal silicon layer with an energy gap (Eg) of about 1.1 eV. Note that light is incident on the n-type second impurity silicon layer 114 (the n-layer) side.

FIG. 9B is an energy band diagram corresponding to the unit cell 116 of FIG. 9A. In FIG. 9B, $Egc_1$ indicates the energy gap of the single crystal silicon layer 113, which is about 1.1 eV. In addition, Ec indicates the level of the bottom of the conduction band, Ev indicates the level of the top of the valence band, and Ef indicates Fermi level.

As for the carriers (electrons and holes) generated by photoexcitation, electrons flow toward the n-layer, whereas holes flow toward the p-layer. Since single crystal silicon is an indirect transition semiconductor with an energy gap of about 1.1 eV, its light absorption coefficient is low and a thickness of about 1 μm is necessary to absorb sunlight. In this embodiment mode, through epitaxial growth by an atmospheric pressure plasma CVD method, the thickness of the single crystal silicon layer conducting photoelectric conversion is increased. Further, since the epitaxial growth is conducted after reducing crystal defects, a favorable single crystal silicon layer can be increased in thickness. Therefore, light can be absorbed sufficiently in the photoelectric conversion layer; accordingly, a carrier collection efficiency can be increased and a photoelectric conversion efficiency can be improved.

In the unit cell 116, the first single crystal silicon layer 110 is formed of a slice of a single crystal silicon substrate and the second single crystal silicon layer 112 is epitaxially grown, whereby a BSF and a pin-junction can be formed. Therefore, by a light trapping effect by a BSF and drift of carriers by an internal electric field, the carrier collection efficiency can be increased and a photoelectric conversion efficiency can be increased.

Note that this embodiment mode can be combined as appropriate with any of other embodiment modes.

Embodiment Mode 2

In this embodiment mode, a method for manufacturing a photoelectric conversion device which is different from the method described in the above embodiment mode is described. In the above embodiment mode, an example is given in which crystal defects in the first single crystal silicon layer 110 which is formed of a slice of the single crystal silicon substrate 101 are repaired by laser treatment. In this embodiment mode, a method is described in which a surface of the first single crystal silicon layer 110 is removed to reduce crystal defects. Note that other structures are based on the description in the above embodiment mode and the description thereof is omitted here.

By performing etching treatment or polishing treatment on a surface which is the separation plane of the first single crystal silicon layer 110, which is a thin slice of the single crystal silicon substrate 101, crystal defects of the surface which is the separation plane can be eliminated.

For example, the above-described steps up to the step of FIG. 3A are performed to obtain the first single crystal silicon layer 110 fixed over the supporting substrate 102. Then, the surface which is the separation plane of the first single crystal silicon layer 110 is etched. The etching may be either or both dry etching and wet etching. Further, CMP treatment may be employed instead of etching treatment to eliminate crystal defects of the surface of the first single crystal silicon layer 110. The crystal defect elimination treatment is preferably performed on a superficial part with a thickness of 5 nm to 50 nm from the surface of the first single crystal silicon layer 110. After that, a photoelectric conversion device may be manufactured through the steps of FIG. 3C and FIGS. 4A to 4C.

Further, crystal defects in the single crystal silicon layer can be reduced by performing both laser treatment and etching treatment. For example, after the first single crystal silicon layer 110 is obtained by separating a thin slice from the single crystal silicon substrate 101, the surface which is the separation plane of the first single crystal silicon layer 110 is removed by dry etching and the plane is irradiated with a laser beam successively. Thus, by removing a separation plane side of the single crystal silicon layers which includes many crystal defects and then delivering a laser beam thereto, crystal defects can be prevented from being included in the single crystal silicon layer. Needless to say, the etching may be wet etching or CMP. Further, RTA or flash lamp irradiation may be performed instead of laser beam irradiation.

In the method for manufacturing a photoelectric conversion device in this embodiment mode, epitaxial growth is conducted after eliminating crystal defects. Accordingly, crystal defects can be prevented from being included into a single crystal silicon layer when epitaxial growth is conducted and a favorable single crystal silicon layer with a large thickness can be formed. As a result, a photoelectric conversion device with an improved photoelectric conversion efficiency can be manufactured.

Note that this embodiment mode can be combined as appropriate with any of other embodiment modes.

Embodiment Mode 3

In this embodiment mode, a method for manufacturing a photoelectric conversion device which is different from the methods described in the above embodiment modes is described with reference to FIGS. 10A to 10D, FIGS. 11A to 11D, and FIGS. 12A to 12D. In specific, a method for forming the fragile layer 103 and the first impurity silicon layer 108 in the single crystal silicon substrate 101, and forming the first electrode 106, and the insulating layer 104 over the single crystal silicon substrate 101 is described. Note that other structures are based on the description in the above embodiment modes and the description thereof is omitted here.

In the above embodiment mode, the example (1) is described as the formation order of the fragile layer 103, the first impurity silicon layer 108, the first electrode 106, and the insulating layer 104. In this embodiment mode, the examples (2) to (4) are described.

For example, as illustrated in FIGS. 10A to 10D, the protection layer 105 is formed on one surface of the single crystal silicon substrate 101. An impurity element imparting one conductivity type is added to the single crystal silicon substrate 101 through the surface on which the protection layer 105 is formed to form the first impurity silicon layer 108 (see FIG. 10A). The first impurity silicon layer 108 is formed along the surface of the single crystal silicon substrate 101 and between the protection layer 105 and the single crystal silicon substrate 101.

Figure 10A:
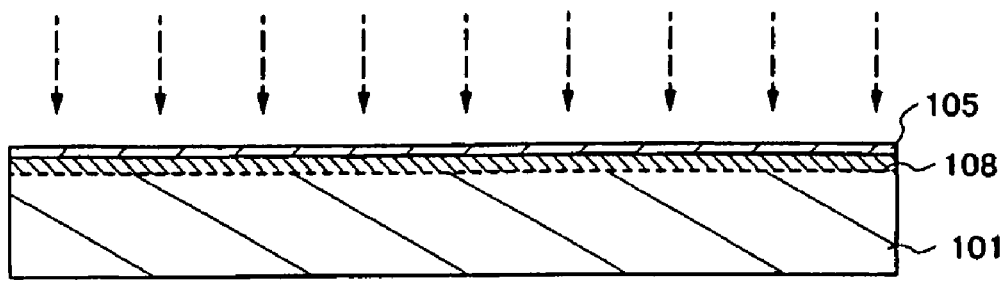
FIGS. 10A to 10D are cross-sectional views illustrating a modification example of a method for manufacturing a photoelectric conversion device according to an aspect of the present invention.
Figure 10B:
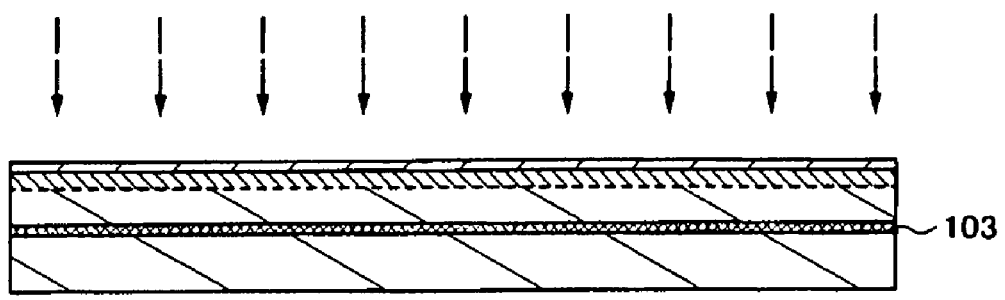

Then, the fragile layer 103 is formed in a region at a predetermined depth from the surface of the single crystal silicon substrate 101 by irradiating the single crystal silicon substrate 101 with ions or cluster ions through the surface of the single crystal silicon substrate 101 on which the protection layer 105 is formed (see FIG. 10B).

Figure 10C:
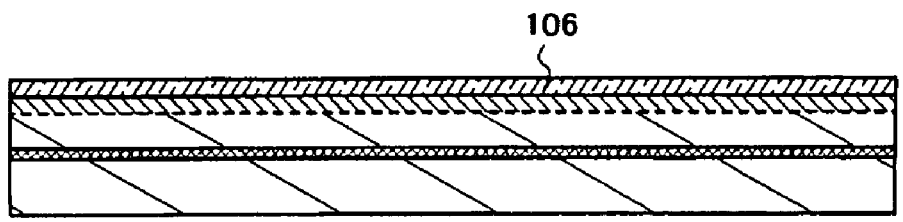
Figure 10D:
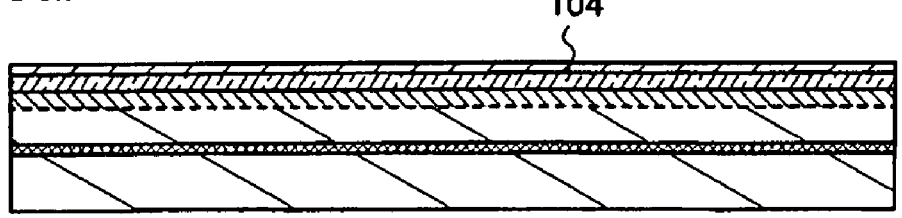

Then, after a material layer such as the protection layer 105 which is formed over the first impurity silicon layer 108 is removed, the first electrode 106 is formed (see FIG. 10C). Then, the insulating layer 104 is formed over the first electrode 106 (see FIG. 10D). After that, a photoelectric conversion device may be manufactured through the steps of FIG. 2E, FIGS. 3A to 3C, and FIGS. 4A to 4C.

In such a formation order, hydrogen passes through the first impurity silicon layer 108 when irradiation with ions or cluster ions generated from a source gas including hydrogen is performed for forming the fragile layer 103. Thus, hydrogenation of the first impurity silicon layer 108 can also be performed.

Figure 11A:
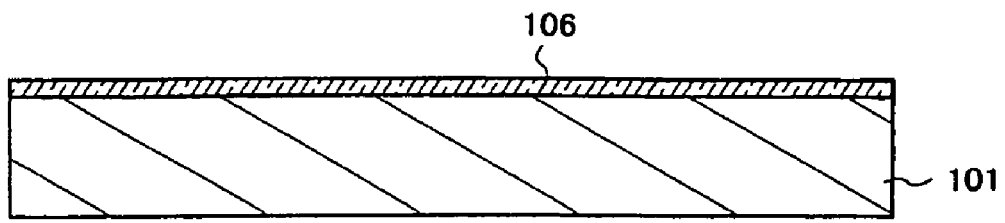
FIGS. 11A to 11D are cross-sectional views illustrating a modification example of a method for manufacturing a photoelectric conversion device according to an aspect of the present invention.

Alternatively, as illustrated in FIGS. 11A to 11D, the first electrode 106 is formed on one surface of the single crystal silicon substrate 101 (see FIG. 11A). The first electrode 106 is formed after removing a material layer such as a native oxide layer which is formed over the single crystal silicon substrate 101.

Figure 11B:
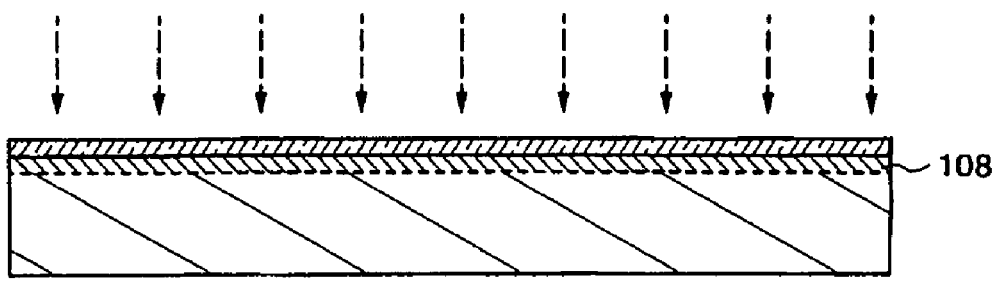

Then, an impurity element imparting one conductivity type is added to the single crystal silicon substrate 101 through the surface on which the first electrode 106 is formed to form the first impurity silicon layer 108 (see FIG. 11B). The first impurity silicon layer 108 is formed along the one surface of the single crystal silicon substrate 101 and between the first electrode 106 and the single crystal silicon substrate 101.

Figure 11C:
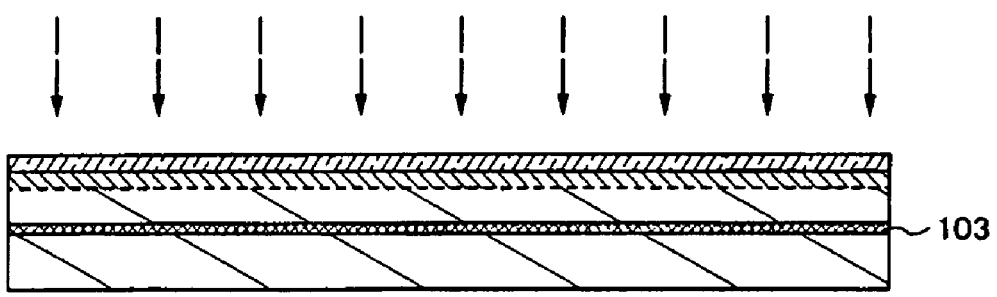
Figure 11D:
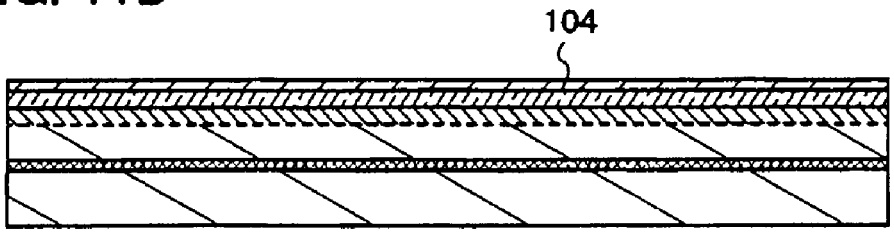

Then, the fragile layer 103 is formed in a region at a predetermined depth in the single crystal silicon substrate 101 by irradiating the single crystal silicon substrate 101 with ions or cluster ions through the surface of the single crystal silicon substrate 101 on which the first electrode 106 is formed (see FIG. 11C). Then, the insulating layer 104 is formed over the first electrode 106 (see FIG. 11D). After that, a photoelectric conversion device may be manufactured through the steps of FIG. 2E, FIGS. 3A to 3C, and FIGS. 4A to 4C.

Figure 12A:
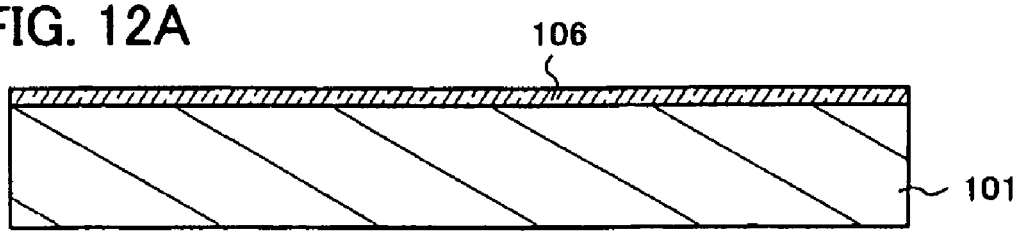
FIGS. 12A to 12D are cross-sectional views illustrating a modification example of a method for manufacturing a photoelectric conversion device according to an aspect of the present invention.
Figure 12B:
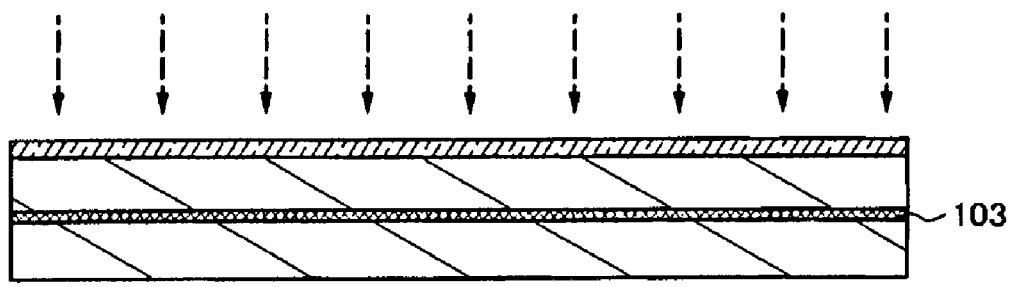

Further alternatively, as illustrated in FIGS. 12A to 12D, after the first electrode 106 is formed on one surface of the single crystal silicon substrate 101 (see FIG. 12A), the fragile layer 103 is formed in a region at a predetermined depth in the single crystal silicon substrate 101 by irradiating the single crystal silicon substrate 101 with ions or cluster ions through the surface of the single crystal silicon substrate 101 on which the first electrode 106 is formed (see FIG. 12B).

Figure 12C:
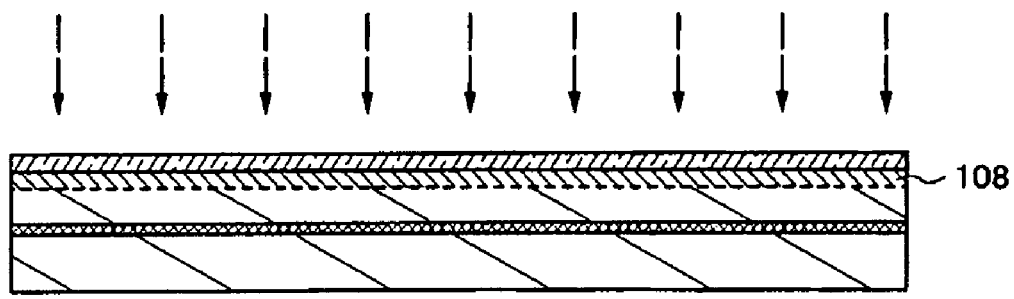
Figure 12D:
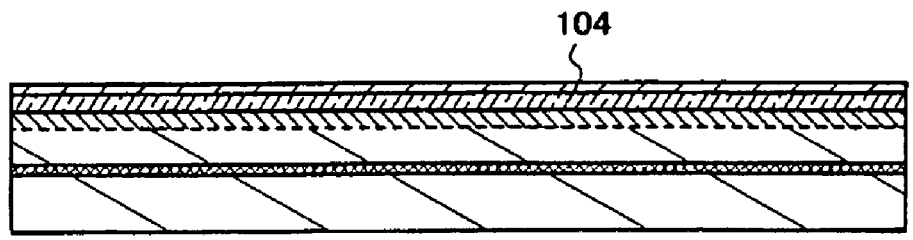

Then, an impurity element imparting one conductivity type is added through the surface on which the first electrode 106 is formed to form the first impurity silicon layer 108 along the one surface of the single crystal silicon substrate 101 (see FIG. 12C). After that, the insulating layer 104 is formed over the first electrode 106 (see FIG. 12D). The first impurity silicon layer 108 is formed between the single crystal silicon substrate 101 and the first electrode 106. After that, a photoelectric conversion device may be manufactured through the steps of FIG. 2E, FIGS. 3A to 3C, and FIGS. 4A to 4C.

In the formation orders illustrated in FIGS. 11A to 11C and FIGS. 12A to 12C, the first electrode 106 serves as a protection layer for addition of an impurity element and irradiation with ions or cluster ions; accordingly, an additional protection layer is not needed. Therefore, steps of forming and removing a protection layer can be omitted, which leads to shortening of the process.

Note that this embodiment mode can be combined as appropriate with any of other embodiment modes.

Embodiment Mode 4

In this embodiment mode, a photoelectric conversion device having a structure different from the structures described in the above embodiment modes is described with reference to FIG. 13. In specific, while an example in which bonding is formed with the insulating layer 104 and the supporting substrate 102 is described in the above embodiment modes, an example in which bonding is formed with the first electrode 106 and the supporting substrate 102 without provision of the insulating layer 104 is described in this embodiment mode.

Figure 13:
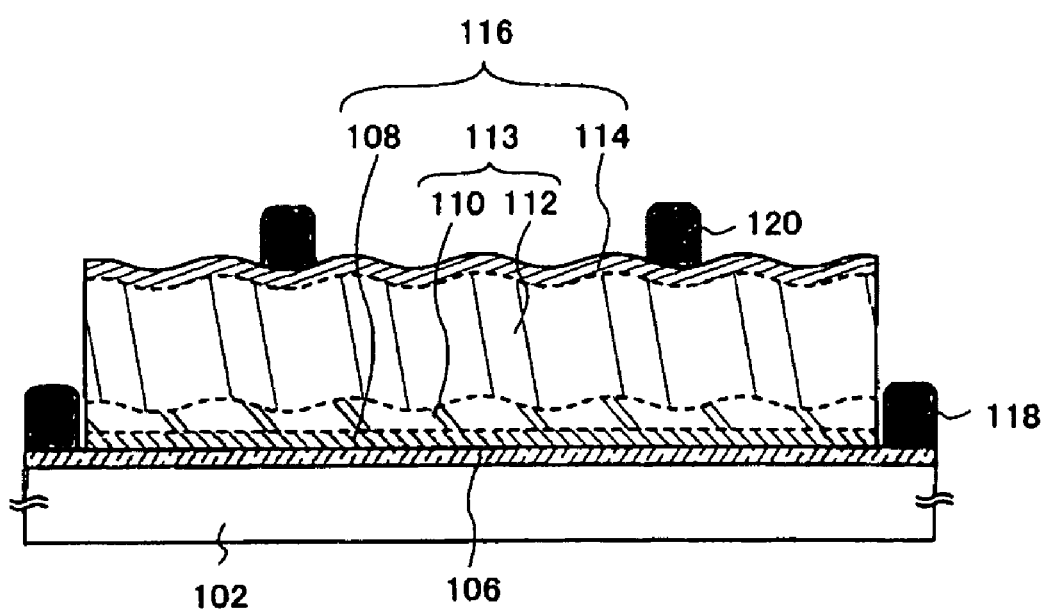
FIG. 13 is a cross-sectional view illustrating an example of a photoelectric conversion device according to an aspect of the present invention.

FIG. 13 illustrates an example of the photoelectric conversion device in which the first electrode 106 and the supporting substrate 102 are directly bonded and attached to each other. When the first electrode 106 has a smooth surface, specifically, when the first electrode 106 has a surface with an average surface roughness Ra of 0.5 nm or less, preferably 0.3 nm or less, the first electrode 106 and the supporting substrate 102 can be bonded together without formation of the insulating layer 104 illustrated in FIG. 1B. After the first electrode 106 is formed and a surface of the first electrode 106 which serves as a bonding plane is sufficiently cleaned, the first electrode 106 and the supporting substrate 102 are disposed in contact with each other to form a bonding. Needless to say, before bonding, the bonding plane of the first electrode 106 and/or the bonding plane of the supporting substrate 102 may be activated. In addition, after the first electrode 106 and the supporting substrate 102 are bonded together, heat treatment or pressure treatment may be performed. When the first electrode 106 having a smooth surface is formed, the insulating layer 104 does not need to be provided additionally. Accordingly, the process can be shortened. Note that even when the first electrode 106 has an average surface roughness Ra in the above range, an insulating layer which serves as a bonding layer may be formed in order to further increase the smoothness of the bonding plane and increase the bonding strength. Further, an insulating layer that serves as a blocking layer may be formed on the supporting substrate 102.

Alternatively, it is possible to manufacture a photoelectric conversion device by providing the first electrode 106 on the supporting substrate 102 and then directly attaching the first electrode 106 and the single crystal silicon substrate. When the first electrode 106 on the supporting substrate 102 has a smooth surface, specifically, when the first electrode 106 has a surface with an average surface roughness Ra of 0.5 nm or less, preferably, 0.3 nm or less, the first electrode 106 and the single crystal silicon substrate can be directly bonded together. Note that the fragile layer 103 and the first impurity silicon layer 108 may be formed in the single crystal silicon substrate before bonding the first electrode 106 and the single crystal silicon substrate.

Note that this embodiment mode can be combined as appropriate with any of other embodiment modes.

Embodiment Mode 5

In this embodiment mode, an example of reprocessing treatment which is performed on the separation substrate 130, which is the single crystal silicon substrate from which the single crystal silicon layer is separated.

As described above with reference to FIG. 3A, the separation substrate 130 from which the first single crystal silicon layer 110 is separated is obtained. The separation substrate 130 can be reused as the single crystal silicon substrate by being subjected to reprocessing treatment.

As the reprocessing treatment of the separation substrate, polishing treatment, etching treatment, heat treatment, laser treatment, or the like can be used. As for the polishing treatment, a chemical mechanical polishing (CMP) method, a mechanical polishing method, a liquid jet polishing method, or the liked can be given. Through the polishing treatment, a substrate having a surface with excellent planarity can be obtained.

For example, it is preferable that the surface of the separation substrate 130 which is a separation plane be removed by wet etching, and then the surface be polished to be planarized.

First, crystal defects or an insulating layer remaining on the surface of the separation substrate 130 which is the separation plane is removed by wet etching. In some cases, the single crystal silicon layer cannot be separated at an end portion of the single crystal silicon substrate and may remain as a projection at the end portion after the separation. In such a case where the projection remains, an insulating layer or the like which has been formed on the single crystal silicon substrate may also remain after the separation. The projection is also removed by this wet etching. A hydrofluoric acid-based solution is used for the wet etching in the case of removing the insulating layer. Further, tetra methyl ammonium hydroxide (TMAH) or the like can be used in the case of removing crystal defects and the projection.

Successively, the surface of the separation substrate 130 after being subjected to etching treatment is polished by CMP or mechanical polishing. In order to make the separation substrate 130 have a smooth surface, the separation substrate 130 is preferably polished by a thickness of about 1 μm to 10 μm. After the polishing, hydrofluoric acid cleaning, RCA cleaning, cleaning with oxygen-containing water, or cleaning with a mixed solution of an ammonium solution and a hydrogen peroxide solution (which is referred to as APM cleaning or SC1 cleaning) is preferably performed because abrasive particles or the like remain on the surface of the separation substrate 130.

Through the above-described process, the separation substrate 130 can be reprocessed as a single crystal silicon substrate. The reprocessed single crystal silicon substrate may be reused as a single crystal silicon substrate as a raw material for manufacturing a photoelectric conversion device, or may be used for another purpose. For example, the single crystal silicon substrate which is obtained by reprocessing the separation substrate may be used for manufacturing a photoelectric conversion device through the above-described steps of FIGS. 2A to 2E, FIGS. 3A to 3C, and FIGS. 4A to 4C. In other words, a plurality of photoelectric conversion devices can be manufactured with one single crystal silicon substrate.

Further, in the present invention, a single crystal silicon layer which is a thin slice separated from a single crystal silicon substrate is increased in thickness by an atmospheric pressure plasma CVD method. Accordingly, the thickness of the single crystal silicon layer which is separated from the single crystal silicon substrate can be small, accordingly, the thickness of the remaining separation substrate can be large. As a result, the number of times of reusing the single crystal silicon substrate can be increased. Accordingly, resources can be effectively used, which can lead to reduction in cost.

Note that this embodiment mode can be combined as appropriate with any of other embodiment modes.

Embodiment Mode 6

This embodiment mode describes an example of a photoelectric conversion device in which a plurality of unit cells are stacked. This embodiment mode describes a so-called tandem photoelectric conversion device in which two unit cells are stacked.

Figure 14:
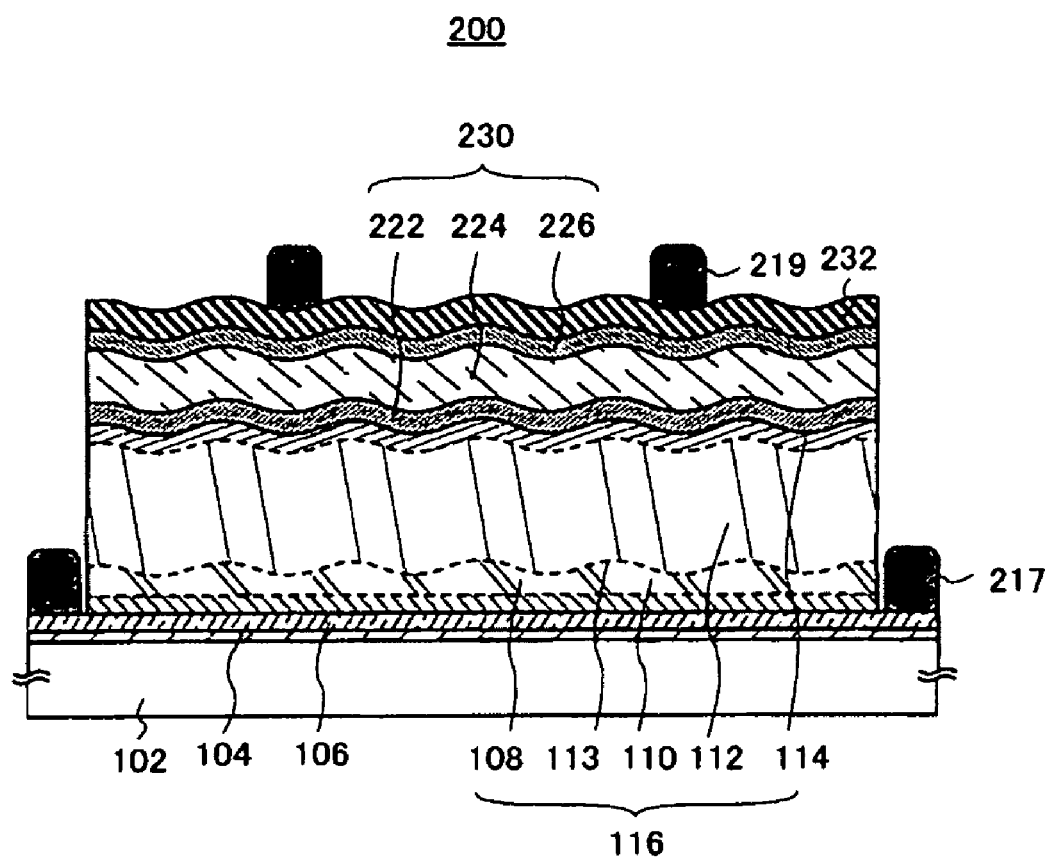
FIG. 14 is a cross-sectional view illustrating an example of a tandem photoelectric conversion device according to an aspect of the present invention.

FIG. 14 illustrates an example of a cross-sectional schematic diagram of a tandem photoelectric conversion device 200 of this embodiment mode. The photoelectric conversion device 200 has a structure in which the first unit cell 116 and a second unit cell 230 are stacked over the supporting substrate 102. The first electrode 106 is provided between the supporting substrate 102 and the first unit cell 116, and the insulating layer 104 is provided between the first electrode 106 and the supporting substrate 102. In this embodiment mode, the structure and manufacturing method for the supporting substrate 102 to the first unit cell 116 is based on any of the above embodiment modes, and repeated description are omitted.

The photoelectric conversion device 200 has a structure in which light is incident on the second unit cell 230 side, and the energy gap of a photoelectric conversion layer of the second unit cell 230 is larger than that of a photoelectric conversion layer of the first unit cell 116. In specific, the photoelectric conversion layer of the second unit cell 230 is formed of a non-single-crystal silicon layer, and the photoelectric conversion layer of the first unit cell 116 is formed of a single crystal silicon layer. By stacking the photoelectric conversion layers having different energy gaps, a wavelength range of light that can be absorbed is increased and a photoelectric conversion efficiency can be improved. In particular, sunlight includes light of a wide wavelength range from a short wavelength to a long wavelength. Light of a wide wavelength range can be efficiently absorbed by employing the structure described in this embodiment mode. In addition, a photoelectric conversion layer with a large energy gap is disposed on the light incidence side, whereby light with a short wavelength and light with a long wavelength can be efficiently absorbed.

The second unit cell 230 has a stacked structure in which a third impurity silicon layer 222 having one conductivity type, a non-single-crystal silicon layer 224, and a fourth impurity silicon layer 226 having a conductivity type opposite to the one conductivity type (the conductivity type of the third impurity silicon layer 222) are formed in that order. In addition, the second unit cell 230 is formed over the first unit cell 116. In specific, the first impurity silicon layer 108, the single crystal silicon layer 113, the second impurity silicon layer 114, the third impurity silicon layer 222, the non-single-crystal silicon layer 224, and the fourth impurity silicon layer 226 are formed in that order. The third impurity silicon layer 222 has an opposite conductivity type to the second impurity silicon layer 114 of the first unit cell 116 which is in contact with the third impurity silicon layer 222.

Amorphous silicon is typically used for the non-single-crystal silicon layer 224 of the second unit cell 230, but microcrystalline silicon can be used instead of amorphous silicon. The third impurity silicon layer 222 having one conductivity type and the fourth impurity silicon layer 226 having a conductivity type opposite to the one conductivity type are each formed of an amorphous silicon layer or a microcrystal silicon layer which contains an impurity element having a predetermined conductivity type. Amorphous silicon carbide can alternatively be used. When the third impurity silicon layer 222 has p-type conductivity, the fourth impurity silicon layer 226 has n-type conductivity; it is also possible that the third impurity silicon layer 222 have n-type conductivity and the fourth impurity silicon layer 226 have p-type conductivity.

The non-single-crystal silicon layer 224 is formed by a plasma CVD method using a silane-based gas as a source gas. In specific, a hydride of silicon typified by silane or disilane, or a silane-based gas such as a fluoride of silicon or a chloride of silicon can be used. The silane-based gas or the silane-based gas containing hydrogen or a rare gas may be used as the source gas. The non-single-crystal silicon layer 224 can be formed using the source gas with a plasma CVD apparatus by applying a high-frequency electric power with an electric power frequency of 10 MHz to 200 MHz. Instead of applying the high-frequency electric power, a microwave electric power with an electric power frequency of 1 GHz to 5 GHz, typically 2.45 GHz may be applied. The third impurity silicon layer 222 and the fourth impurity silicon layer 226 are similarly formed with a plasma CVD apparatus. In the case of forming a p-type amorphous silicon layer, diborane is added as a doping gas to the source gas. In the case of forming an n-type amorphous silicon layer, phosphine is added as the doping gas. Note that the non-single-crystal silicon layer 224 can alternatively be formed by a sputtering method. The thickness of the non-single-crystal silicon layer 224 is 50 nm or more and 300 nm or less, preferably 100 nm or more and 200 nm or less. In the case of using amorphous silicon for the non-single-crystal silicon layer 224, the energy gap is 1.75 eV. With the thickness within the above range, light with a shorter wavelength than 800 nm can be absorbed and converted into electricity.

The first electrode 106 is provided on the supporting substrate 102 side of the first unit cell 116. A second electrode 232 is provided on a surface side of the second unit cell 230. In addition, a first auxiliary electrode 217 is provided in connection with the first electrode 106 and a second auxiliary electrode 219 is provided in connection with the second electrode 232. The first auxiliary electrode 217 and the second auxiliary electrode 219 serve as extraction electrodes (also referred to as collector electrodes) which extract electric energy converted in the photoelectric conversion layer. In the photoelectric conversion device 200 of this embodiment mode, an electrode serving as a positive electrode and an electrode serving as a negative electrode are provided over the same plane side of the supporting substrate 102. Further, this embodiment mode shows an example of providing an electrode which is connected to the electrode serving as a positive electrode and an electrode which is connected to the electrode serving as a negative electrode. Those electrodes are exposed to the same plane side of the supporting substrate 102 similar to the electrode serving as a positive electrode and the electrode serving as a negative electrode.

In this embodiment mode, the second electrode 232 is formed over the entire surface of the second unit cell 230, and the second auxiliary electrode 219 which is in contact with the second electrode 232 is formed in a grid shape (or a comb-like shape or a pectinate shape). The second unit cell is formed using a non-single-crystal silicon layer here, and the lifetime of carriers is short; therefore, it is preferable to form the second electrode 232 over the entire surface of the substrate. Note that the fourth impurity silicon layer 226 side of the second unit cell 230 is a light incidence plane; therefore, the second electrode 232 is formed using a transparent conductive material.

Next, an example of a method for manufacturing the photoelectric conversion device 200 of this embodiment mode is described with reference to FIGS. 15A and 15B and FIGS. 16A and 16B. Note that since the manufacturing method up to the formation of the second impurity silicon layer 114 of the first unit cell 116 is based on the methods in any of the above embodiment modes, repeated description is omitted.

Figure 15A:
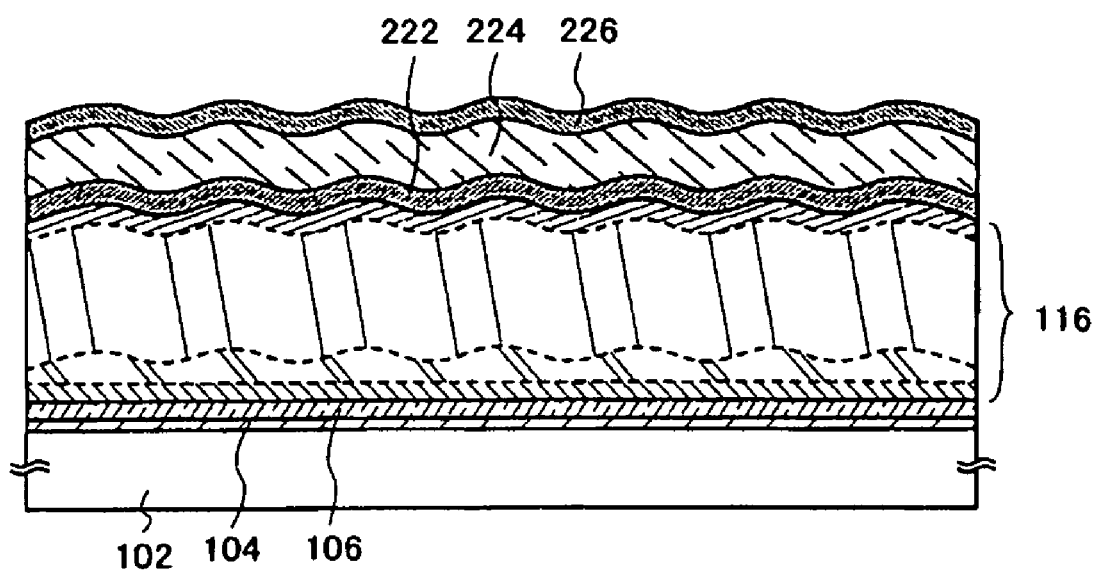
FIGS. 15A and 15B are cross-sectional views illustrating an example of a method for manufacturing a tandem photoelectric conversion device according to an aspect of the present invention.

The third impurity silicon layer 222 having one conductivity type, the non-single-crystal silicon layer 224, and the fourth impurity silicon layer 226 having a conductivity type opposite to the one conductivity type are formed in that order over the first unit cell 116 (see FIG. 15A).

The third impurity silicon layer 222 is formed using an amorphous silicon layer or microcrystalline silicon layer which has an opposite conductivity type to the second impurity silicon layer of the first unit cell 116. Here, a p-type amorphous silicon layer or a p-type microcrystalline silicon layer is formed. In addition, the third impurity silicon layer 222 is formed with a thickness of 10 nm to 100 nm. The non-single-crystal silicon layer 224 is formed using an i-type amorphous silicon layer which does not contain an impurity element imparting a conductivity type, with a thickness of 100 nm to 300 nm, preferably, 100 nm or more and 200 nm or less. The fourth impurity silicon layer 226 is formed using an amorphous silicon layer or a microcrystal silicon layer having an opposite conductivity type to the third impurity silicon layer 222. Here, an n-type amorphous silicon layer or an n-type microcrystal silicon layer is formed. The fourth impurity silicon layer 226 is formed with a thickness of 10 nm to 100 nm.

The third impurity silicon layer 222, the non-single-crystal silicon layer 224, and the fourth impurity silicon layer 226 are formed by a CVD method or a sputtering method. Preferably, these layers are formed by a plasma CVD method, and as electric power frequency for excitation of plasma, the HF band or the VHF band from 10 MHz to 200 MHz, or microwave from 1 GHz to 5 GHz, for example, 2.45 GHz is applied. As the source gas, a hydride of silicon such as silane or disilane, or a silane-based gas such as a fluoride of silicon or a chloride of silicon is used, and hydrogen and/or a rare gas may be mixed as appropriate. In the case of forming a p-type amorphous silicon layer or a p-type microcrystal silicon layer, diborane is added to the source gas. Meanwhile, in the case of forming an n-type amorphous silicon layer or an n-type microcrystal silicon layer, phosphine is added to the source gas. Note that it is preferable that impurity elements contained in the non-single-crystal silicon layer 224 be reduced and oxygen and nitrogen be contained each at $1 \times 10^{19}/cm^3$ or less, preferably, $5 \times 10^{18}/cm^3$ or less.

As described above, the second unit cell 230 can be obtained in which the third impurity silicon layer 222 having one conductivity type, the non-single-crystal silicon layer 224, and the fourth impurity silicon layer 226 having a conductivity type opposite to the one conductivity type are stacked in that order.

Figure 15B:
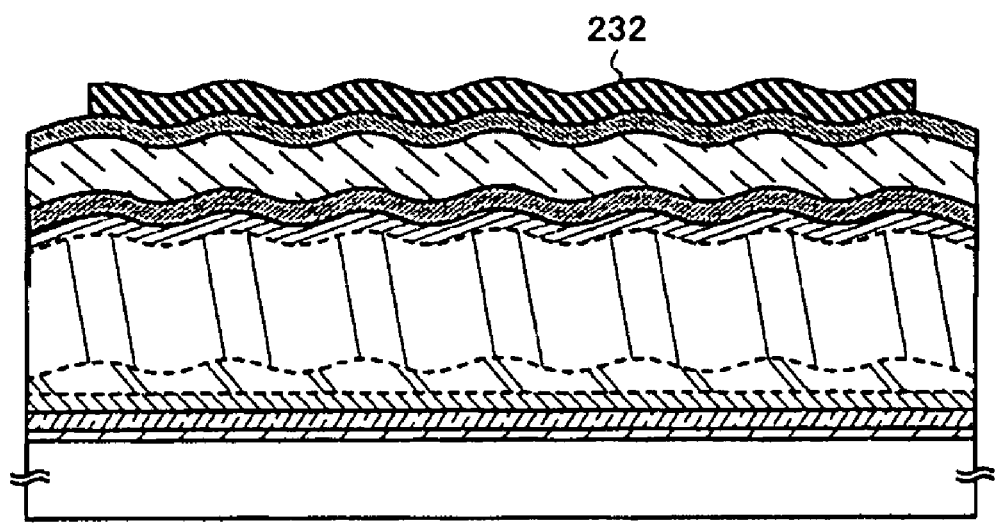

The second electrode 232 is formed over the fourth impurity silicon layer 226 (see FIG. 15B). The second electrode 232 is formed of a transparent conductive material. This is because in the photoelectric conversion device 200 of this embodiment mode, the second electrode 232 side is a light incidence plane. As the transparent conductive material, metal oxide such as indium tin oxide (ITO) alloy, zinc oxide, tin oxide, an alloy of indium oxide and zinc oxide, or the like is used. The second electrode 232 has a thickness of 40 nm to 200 nm, preferably 50 nm to 100 nm. In addition, the sheet resistance of the second electrode 232 may be about 20 Ω/square to 200 Ω/square.

The second electrode 232 is formed by a sputtering method or a vacuum evaporation method. In this embodiment mode, the second electrode 232 is preferably formed using a shadow mask so that the second electrode 232 is selectively formed in a region where the first unit cell 116 and the second unit cell 230 overlap with each other. The second electrode 232 formed selectively can be used as a mask for etching to expose a part (preferably an end portion) of the first electrode 106.

Note that instead of the metal oxide given above, a conductive high molecular material (also referred to as a conductive polymer) can be used for the second electrode 232. As the conductive high molecular material, a π-electron conjugated high molecule can be used. As examples, polyaniline and/or a derivative thereof, polypyrrole and/or a derivative thereof, polythiophene and/or a derivative thereof, and a copolymer of two or more kinds of those materials can be given.

Figure 16A:
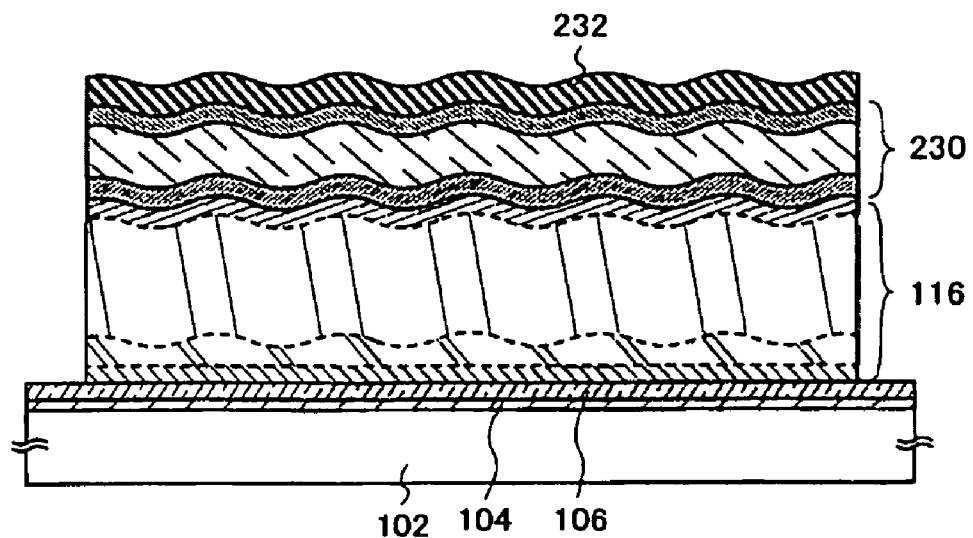
FIGS. 16A and 16B are cross-sectional views illustrating an example of a method for manufacturing a tandem photoelectric conversion device according to an aspect of the present invention.

The fourth impurity silicon layer 226, the non-single-crystal silicon layer 224, the third impurity silicon layer 222, the second impurity silicon layer 114, the second single crystal silicon layer 112, the first single crystal silicon layer 110, and the first impurity silicon layer 108 are etched using the second electrode 232 as a mask to expose a part of the first electrode 106 (see FIG. 16A).

The etching may be dry etching using a fluorine-based gas such as $NF_3$ or $SF_6$ under a condition where at least the etching selectivity between the first electrode 106 and the layers formed over the first electrode 106 (the first impurity silicon layer 108 to the fourth impurity silicon layer 226) is sufficiently high. Since the second electrode 232 can be used as a mask here, a new mask for etching is not necessary. Needless to say, a mask can be formed using resist or an insulating layer.

Figure 16B:
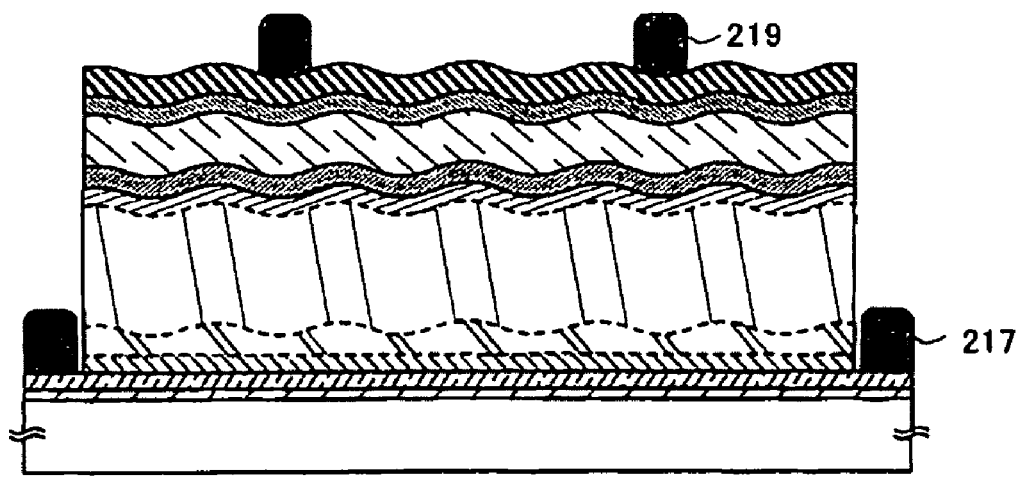

The first auxiliary electrode 217 which is connected to the first electrode 106 and the second auxiliary electrode 219 which is connected to the second electrode 232 are formed (see FIG. 16B).

The second auxiliary electrode 219 is formed so as to have a grid shape (or a comb-like shape or a pectinate shape) as the second electrode 120 illustrated in FIG. 1A when seen from above. This is because the photoelectric conversion device 200 of this embodiment mode has the structure in which light is incident on the second electrode 232 side. With the second auxiliary electrode 219 having such a shape, the effective area where the first and second unit cells receive light is increased.

The first auxiliary electrode 217 is formed in contact with the part of the first electrode 106 which is exposed by the previous etching.

The first electrode 106 is provided over the supporting substrate 102 and the first impurity silicon layer 108 is provided on the first electrode 106. In the photoelectric conversion device, electric energy converted from light is extracted through the positive electrode and the negative electrode. The first electrode 106 serves as one of the positive electrode or the negative electrode; however, it is difficult to extract electric energy to the outside from the first electrode 106 if the first electrode 106 as illustrated in FIG. 15B is used. Therefore, it is preferable that the layers formed over the first electrode 106 be etched to expose a part of the first electrode 106 and an electrode which can serve as a leading electrode (in this case, the first auxiliary electrode 217) be formed.

The first auxiliary electrode and the second auxiliary electrode may be formed by a printing method using nickel, aluminum, silver, lead-tin (solder), or the like. For example, the first auxiliary electrode and the second auxiliary electrode can be formed using a nickel paste or a silver paste by a screen printing method. In the case of forming the auxiliary electrodes by a screen printing method using paste or the like, the thickness of each electrode can be about several micrometers to several hundreds of micrometers. Note that these electrodes are illustrated in the schematic diagram which does not necessarily illustrate the actual dimension.

Thus, the tandem photoelectric conversion device 200 can be formed.

Note that, although not illustrated, a passivation layer which also serves as an antireflection layer is preferably formed also in the tandem photoelectric conversion device 200.

Figure 17:
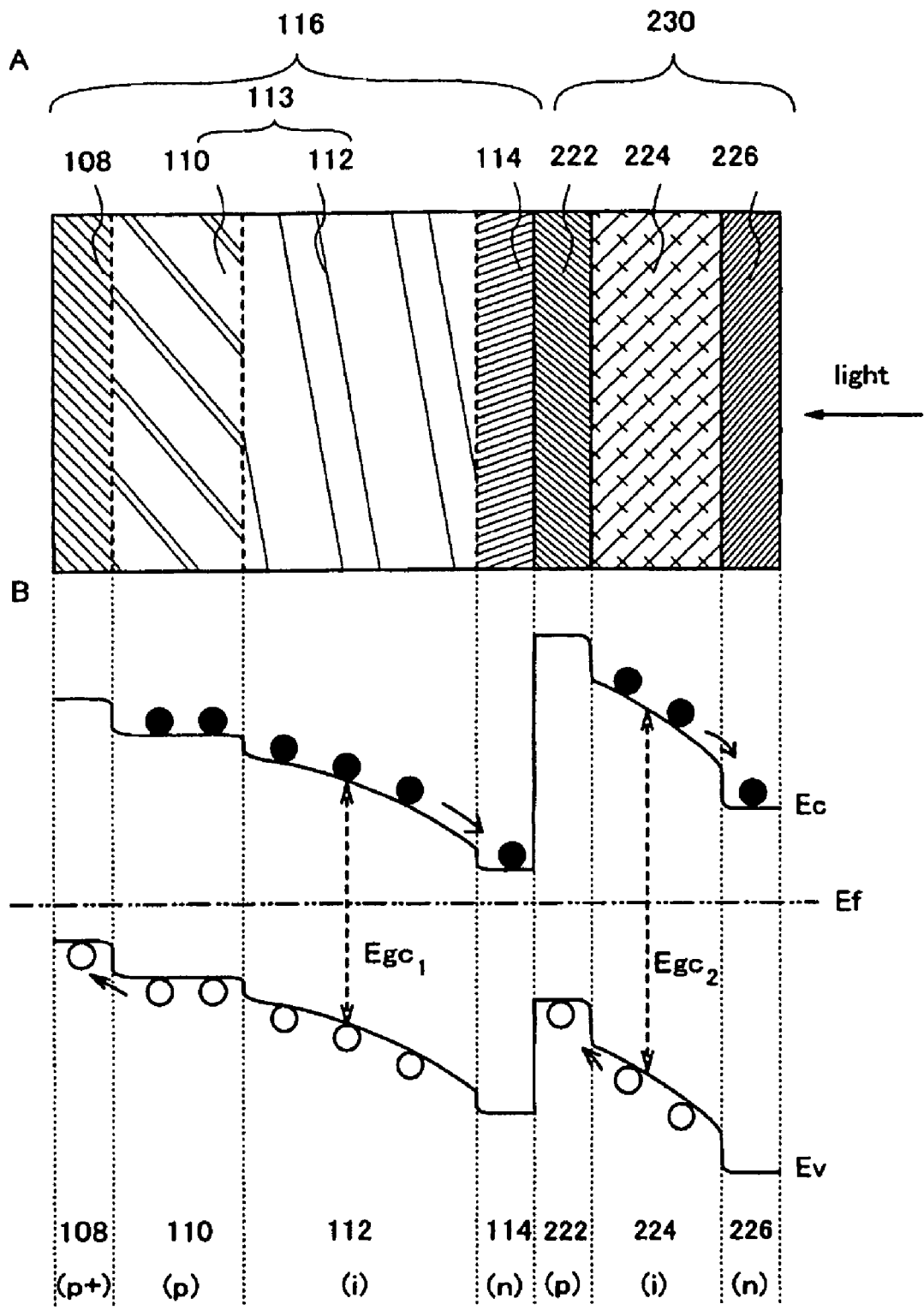
FIG. 17A is a cross-sectional view of a unit cell of a tandem photoelectric conversion device according to an aspect of the present invention and FIG. 17B is an energy band diagram corresponding to FIG. 17A.

FIG. 17A is a cross-sectional schematic diagram illustrating an example of the first unit cell 116 and the second unit cell 230 which are included in the photoelectric conversion device of this embodiment mode. In the first unit cell 116, the $p^+$-type first impurity silicon layer 108 (a $p^+$-layer), a p-type first single crystal silicon layer 110 (a p-layer), the i-type second single crystal silicon layer 112 (an i-layer), and the n-type second impurity silicon layer 114 (an n-layer) are arranged in that order. In the second unit cell 230, the p-type third impurity silicon layer 222 (a p-layer), the i-type non-single-crystal silicon layer 224 (an i-layer), and the n-type fourth impurity silicon layer 226 (an n-layer) are arranged in that order. The unit cell 116 includes a single crystal silicon layer with an energy gap of 1.12 eV. The second unit cell 230 includes a single crystal silicon layer with an energy gap of 1.75 eV. Light is incident on the n-type fourth impurity silicon layer 226 (the n-layer) side. Accordingly, the second unit cell 230 having a non-single-crystal silicon layer with a large energy gap is located on the light incidence side and the first unit cell 116 having a single crystal silicon layer with a small energy gap is located behind the second unit cell 230.

FIG. 17B is an energy band diagram corresponding to the first unit cell 116 and the second unit cell 230 of FIG. 17A. In FIG. 17B, $Egc_1$ indicates the energy gap of the single crystal silicon layer 113, which is about 1.1 eV, and $Egc_2$ indicates the energy gap of the non-single-crystal silicon layer 224, which is about 1.8 eV. Ec indicates the level of the bottom of the conduction band, Ev indicates the level of the top of the valence band, and Ef indicates Fermi level.

As illustrated in the band diagram of FIG. 17B, as for the carriers generated by photoexcitation, electrons flow toward the n-layer, whereas holes flow toward the p-layer. A p-n junction is formed at a connection portion of the first unit cell 116 and the second unit cell 230, which means a diode is inserted in a direction opposite to the direction of current flow from the aspect of an equivalent circuit. In this case, a recombination center is formed at the bonding interface between the second impurity silicon layer 114 and the third impurity silicon layer 222, and recombination current is made to flow at this bonding interface. By forming the second impurity silicon layer 114 and the third impurity silicon layer 222 thereover which has an opposite conductivity type to the second impurity silicon layer 114, a p-n junction can be formed at the connection portion of the first unit cell 116 and the second unit cell 230.

As described above, in the tandem photoelectric conversion device, when the first unit cell 116 having a single crystal silicon layer is used as a bottom cell, light with a long wavelength of 800 nm or more can be absorbed and converted into electricity, which contributes to improvement in photoelectric conversion efficiency. In addition, when the second unit cell 230 having a non-single-crystal silicon layer is used as a top cell, light with a short wavelength of less than 800 nm can be absorbed and converted into electricity, which contributes to improvement in photoelectric conversion efficiency.

In the photoelectric conversion device of this embodiment mode, after crystal defects in the single crystal silicon layer which is obtained by separating a thin slice from the single crystal silicon substrate are reduced, epitaxial growth is conducted by an atmospheric pressure plasma CVD method to increase the single crystal silicon substrate in thickness. Accordingly, a favorable single crystal silicon layer with a large thickness can be obtained. By forming a photoelectric conversion layer with the obtained single crystal silicon layer, a photoelectric conversion efficiency can be improved. Further, the single crystal silicon substrate from which the slice is separated can be reused; accordingly, resources can be utilized effectively.

Further, in the photoelectric conversion device of this embodiment mode, the unit cell including the non-single-crystal silicon layer is stacked over the unit cell including the single crystal silicon layer. That is, a structure in which the unit cells having different energy gaps are stacked is employed. Further, the unit cell having a photoelectric conversion layer with a larger energy gap (a non-single-crystal silicon layer) is located on the light incidence side. Therefore, the wavelength range of light that is absorbed by the photoelectric conversion device can be increased, and sunlight that includes light of a wide wavelength range can be efficiently absorbed.

Accordingly, a photoelectric conversion device with an excellent photoelectric conversion characteristic can be manufactured.

Note that this embodiment mode can be combined as appropriate with any of other embodiment modes.

Embodiment Mode 7

In this embodiment mode, a photoelectric conversion device in which a plurality of unit cells are stacked, specifically, a so-called stacked photoelectric conversion device in which three unit cells are stacked is described with reference to drawings.

Figure 18:
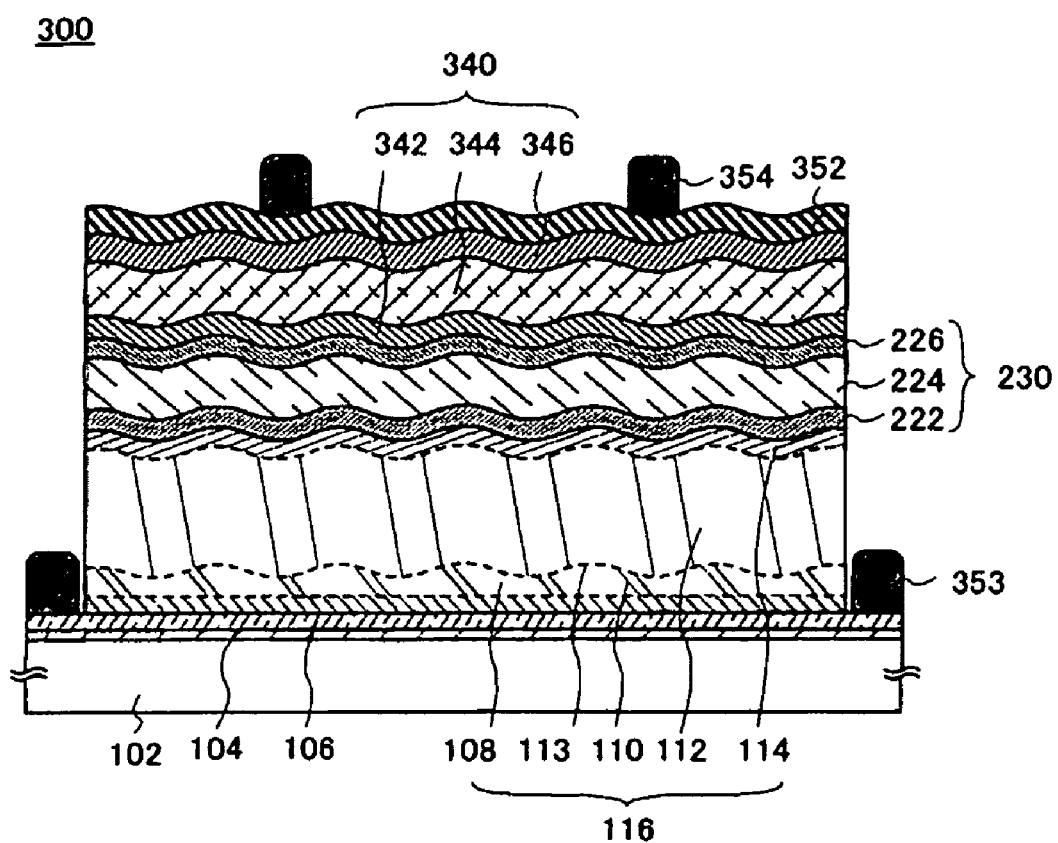
FIG. 18 is a cross-sectional view illustrating an example of a stacked photoelectric conversion device according to an aspect of the present invention.

FIG. 18 is a cross-sectional schematic diagram of an example of a stacked photoelectric conversion device 300 in which three unit cells are stacked. The photoelectric conversion device 300 has a structure in which the first unit cell 116 including a single crystal silicon layer as a photoelectric conversion layer, the second unit cell 230 including a non-single-crystal silicon layer as a photoelectric conversion layer, and a third unit cell 340 including a non-single-crystal silicon layer as a photoelectric conversion layer are stacked in that order over the supporting substrate 102. The first electrode 106 is provided between the supporting substrate 102 and the first unit cell 116, and the insulating layer 104 is provided between the first electrode 106 and the supporting substrate 102. In addition, a first auxiliary electrode 353 is provided as selected in contact with the first electrode 106. A second electrode 352 is provided over the third unit cell 340, and a second auxiliary electrode 354 is provided as selected in contact with the second electrode 352.

Further, the photoelectric conversion device 300 preferably has a structure in which light is incident on the third unit cell 340 side, and it is preferable to arrange the photoelectric conversion layers so that the energy gaps of the photoelectric conversion layers becomes narrower from the third unit cell 340 to the first unit cell 116. For example, it is preferable that the single crystal silicon layer 113 of the first unit cell 116 have an energy gap of 1.12 eV, that the non-single-crystal silicon layer 224 of the second unit cell 230 located closer to the light incidence side than the first unit cell 116 have an energy gap larger than 1.12 eV, and that a non-single-crystal silicon layer 344 of the third unit cell 340 located further closer to the light incidence side have the largest energy gap. The unit cells have different energy gaps and are arranged so that the energy gaps decrease from the light incidence side, whereby the unit cells can absorb light with different wavelength ranges and sunlight that includes light of a wide wavelength range can be absorbed efficiently.

As for the structure and manufacturing method for the supporting substrate 102 to the second unit cell 230, description which is based on the above embodiment modes is omitted or is simplified.

After the process up to the formation of the first unit cell 116 is performed, the third impurity silicon layer 222 having one conductivity type, the non-single-crystal silicon layer 224, and the fourth impurity silicon layer 226 having a conductivity type opposite to the one conductivity type, which form the second unit cell 230, are formed. Then, a fifth impurity silicon layer 342 having one conductivity type, the non-single-crystal silicon layer 344, and a sixth impurity silicon layer 346 having a conductivity type opposite to the one conductivity type are formed over the second unit cell 230 to form the third unit cell 340. The fifth impurity silicon layer 342 has a conductivity type opposite to the fourth impurity silicon layer 226 of the second unit cell 230. In other words, in the photoelectric conversion device 300, over the first electrode 106, the first impurity silicon layer 108 having one conductivity type, the single crystal silicon layer 113, the second impurity silicon layer 114 having a conductivity type opposite to the one conductivity type, the third impurity silicon layer 222 having the one conductivity type, the non-single-crystal silicon layer 224, the fourth impurity silicon layer 226 having a conductivity type opposite to the one conductivity type, the fifth silicon layer 342 having the one conductivity type, the non-single-crystal silicon layer 344, and the sixth silicon layer 346 having a conductivity type opposite to the one conductivity type are stacked in that order.

The fifth impurity silicon layer 342 of the third unit cell 340 is similar to the third impurity silicon layer 222 of the second unit cell 230, and the sixth impurity silicon layer 346 is similar to the fourth impurity silicon layer 226. That is, in the case where the fifth impurity silicon layer 342 has p-type conductivity, the sixth impurity silicon layer 346 has n-type conductivity; and in the case where the fifth impurity silicon layer 342 has n-type conductivity, the sixth impurity silicon layer 346 has p-type conductivity. In the case of forming a p-type impurity silicon layer, diborane is added to a source gas. Meanwhile, in the case of forming an n-type impurity silicon layer, phosphine is added to a source gas.

Figure 19:
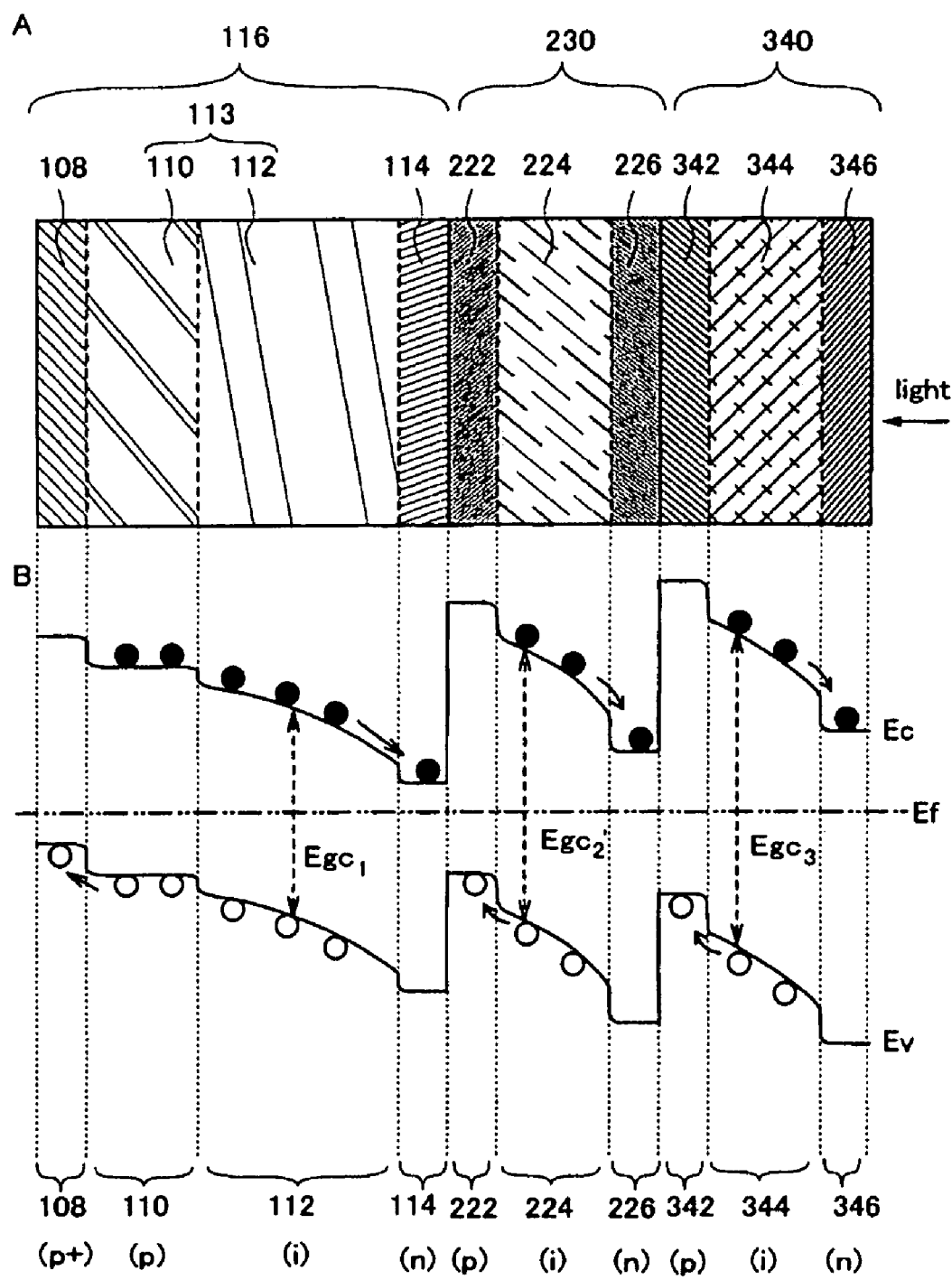
FIG. 19A is a cross-sectional view of a unit cell of a stacked photoelectric conversion device according to an aspect of the present invention and FIG. 19B is an energy band diagram corresponding to FIG. 19A.

Here, FIG. 19A is a cross-sectional schematic diagram illustrating an example of the first unit cell 116, the second unit cell 230, and the third unit cell 340 which are included in the photoelectric conversion device 300 of this embodiment mode. In the illustrated example, the first unit cell 116 includes the p$^+$-type first impurity silicon layer 108 (the p$^+$-layer), the p-type first single crystal silicon layer 110 (the p-layer), the i-type second single crystal silicon layer 112 (the i-layer), and the n-type second impurity silicon layer 114 (the n-layer); the second unit cell 230 includes the p-type third impurity silicon layer 222 (the p-layer), the i-type non-single-crystal silicon layer 224 (the i-layer), and the n-type fourth impurity silicon layer 226 (the n-layer); and the third unit cell 340 includes the p-type fifth impurity silicon layer 342 (the p-layer), the i-type non-single-crystal silicon layer 344 (the i-layer), and the n-type sixth impurity silicon layer 346 (the n-layer).

FIG. 19B is an energy band diagram corresponding to the first unit cell 116, the second unit cell 230, and the third unit cell 340 of FIG. 19A. In FIG. 19B, $Egc_1$ indicates the energy gap of the single crystal silicon layer 113, $Egc_2'$ indicates the energy gap of the non-single-crystal silicon layer 224, and $Egc_3$ indicates the energy gap of the non-single-crystal silicon layer 344. In addition, Ec indicates the level of the bottom of the conduction band, Ev indicates the level of the top of the valence band, and Ef indicates Fermi level. The first unit cell 116 includes a single crystal silicon layer having an energy gap of $Egc_1$, the second unit cell 230 includes a non-single-crystal silicon layer having an energy gap of $Egc_2'$, which is larger than $Egc_1$, and the third unit cell 340 includes a non-single-crystal silicon layer having an energy gap of $Egc_3$, which is larger than $Egc_2'$. Note that light is incident on the n-type sixth impurity silicon layer 346 (the n-layer) side. Accordingly, the unit cells having photoelectric conversion layers are arranged in such a manner that their energy gaps decrease from the light incidence side.

As illustrated in the band diagram of FIG. 19B, as for the carriers generated by photoexcitation, electrons flow toward the n-layer, whereas holes flow toward the p-layer. A p-n junction is formed at a connection portion of the first unit cell 116 and the second unit cell 230, which means a diode is inserted in a direction opposite to the direction of current flow from the aspect of an equivalent circuit. In this case, a recombination center is formed at the bonding interface between the second impurity silicon layer 114 and the third impurity silicon layer 222, and recombination current is made to flow at this bonding interface. By forming the second impurity silicon layer 114 and the third impurity silicon layer 222 having an opposite conductivity type to the second impurity silicon layer 114, a p-n junction can be formed in a connection portion of the first unit cell 116 and the second unit cell 230. In addition, a p-n junction is also formed at a connection portion of the second unit cell 230 and the third unit cell 340, and a diode is inserted in a direction opposite to the direction of current flow from the aspect of an equivalent circuit. In this case, a recombination center is formed at the bonding interface between the fourth impurity silicon layer 226 and the fifth impurity silicon layer 324, and recombination current is made to flows at this bonding interface.

As described above, in the stacked photoelectric conversion device, the wavelength range of light that is absorbed can be wider, which contributes to further improvement in photoelectric conversion efficiency.

Note that this embodiment mode can be combined as appropriate with any of other embodiment modes.

Embodiment Mode 8

Figure 20A:
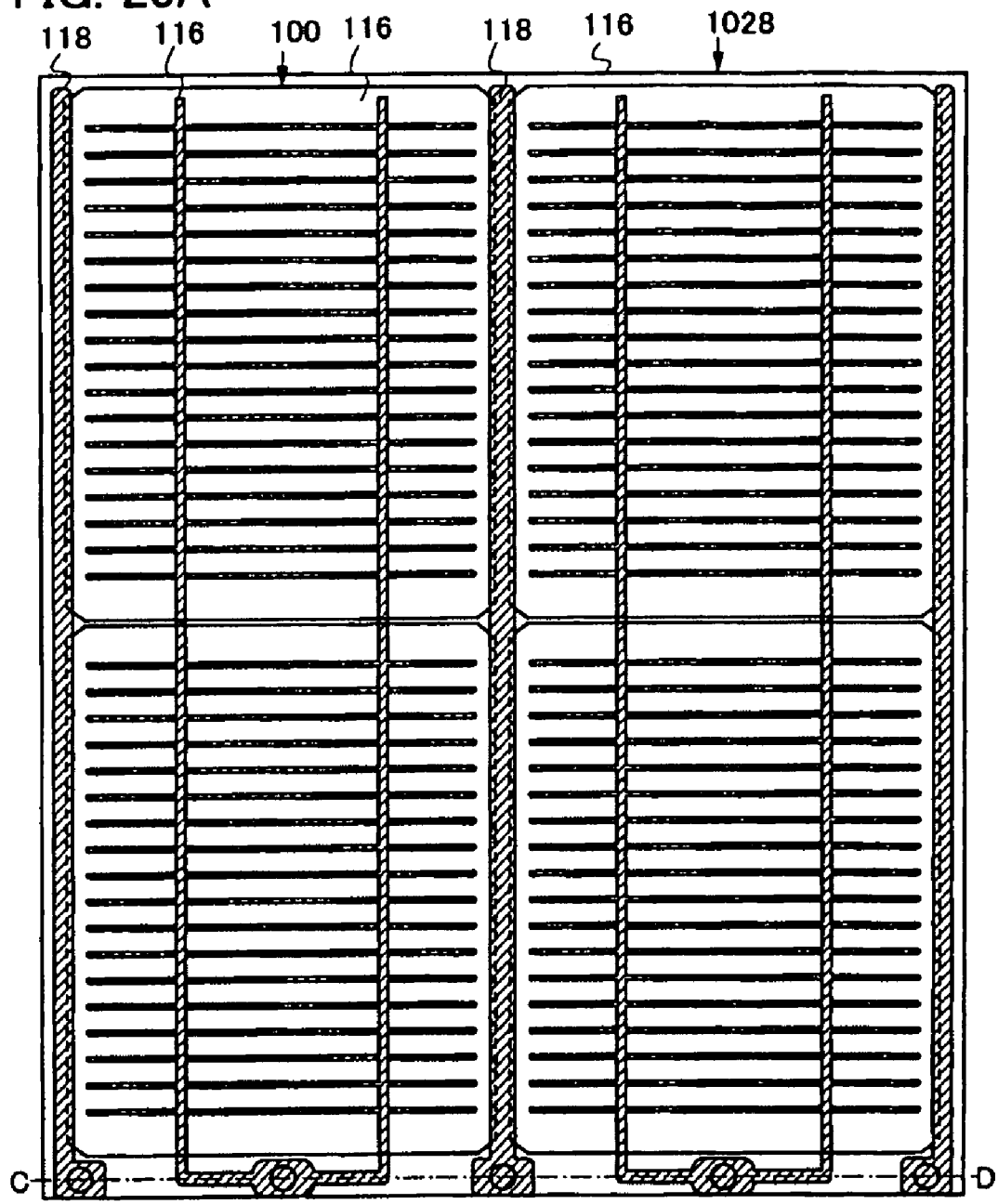
FIGS. 20A and 20B are conceptual diagrams illustrating a structure of a solar photovoltaic module.

A solar photovoltaic module can be manufactured using the photoelectric conversion device obtained in Embodiment Modes 1 to 7. In this embodiment mode, an example of a solar photovoltaic module using the photoelectric conversion device described in any of the above embodiment modes is illustrated in FIG. 20A. A solar photovoltaic module 1028 includes the unit cell 116 provided over one surface of the supporting substrate 102. Between the supporting substrate 102 and the unit cell 116, the insulating layer 104 and the first electrode 106 are provided in that order from the supporting substrate 102 side. The first electrode 106 is connected to the auxiliary electrode 118.

Figure 20B:
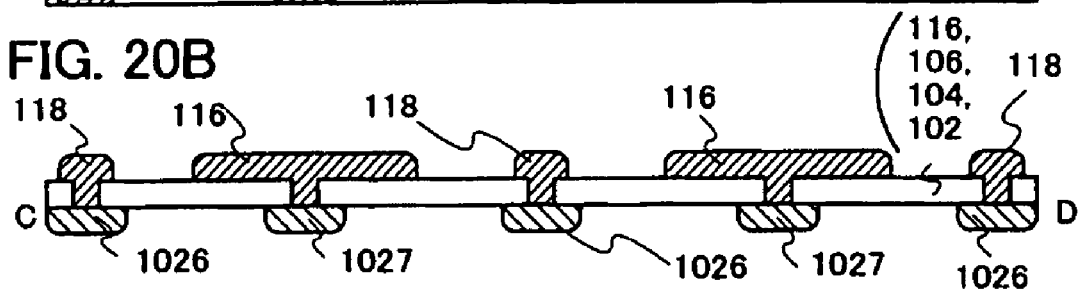

The auxiliary electrode 118 and the second electrode 120 are formed on the one surface side of the supporting substrate 102 (the side where the unit cell 116 is formed) and are connected to a first back surface electrode 1026 and a second back surface electrode 1027 which are used for a connector, respectively in end regions of the supporting substrate 102. FIG. 20B is a cross-sectional view along a line C-D. The auxiliary electrode 118 is connected to the first back surface electrode 1026 through a penetration opening of the supporting substrate 102, and the second electrode 120 is connected to the second back surface electrode 1027 through a penetration opening of the supporting substrate 102.

In this manner, the unit cell 116 is provided over the supporting substrate 102 to form the photoelectric conversion device 100. Thus, the solar photovoltaic module 1028 can be made thin.

Note that this embodiment mode can be combined as appropriate with any of other embodiment modes.

Embodiment Mode 9

Figure 21:
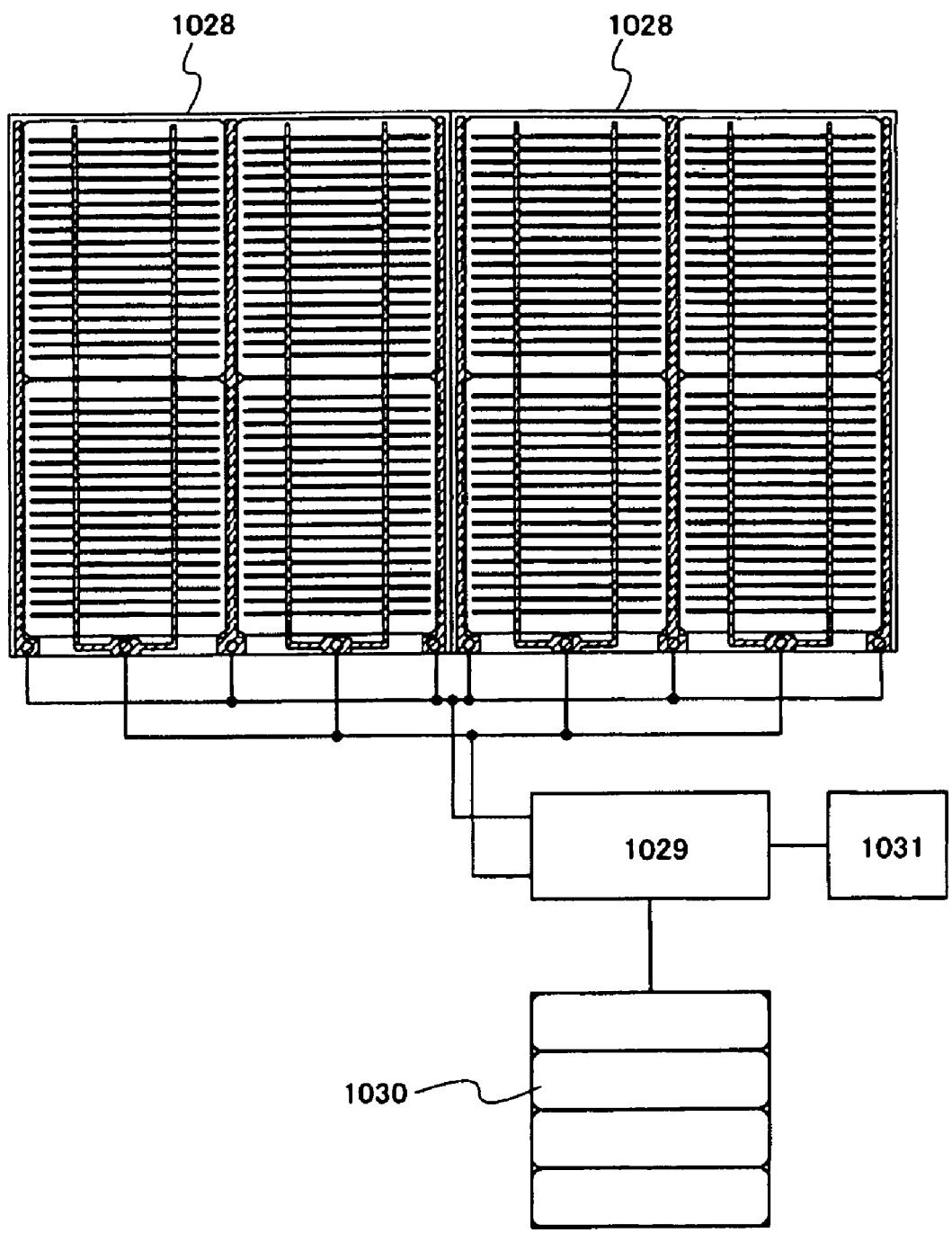
FIG. 21 is a conceptual diagram illustrating an example of a solar photovoltaic system.

FIG. 21 illustrates an example of a photovoltaic power generation system using the solar photovoltaic module 1028 described in Embodiment Mode 8. The output power of one or a plurality of solar photovoltaic modules 1028 charges a storage battery 1030 using a charge control circuit 1029. When the charged amount of the storage battery 1030 is large, the output power is output directly to a load 1031 in some cases.

When an electric double layer capacitor is used as the storage battery 1030, the battery can be charged rapidly without chemical reaction in charging. In addition, compared with a lead-acid battery or the like which uses chemical reaction, the storage battery can be increased in lifetime by about 8 times and in charging and discharging efficiency by 1.5 times. As the load 1031, a lighting apparatus such as a fluorescent lamp, a light emitting diode, or an electroluminescent panel; a small electronic appliance; or the like can be given. In this manner, the solar photovoltaic module using the photoelectric conversion device of the present invention can be used in a variety of applications.

Note that this embodiment mode can be combined as appropriate with any of other embodiment modes.

This application is based on Japanese Patent Application serial no. 2007-338578 filed with Japan Patent Office on Dec. 28, 2007, the entire contents of which are hereby incorporated by reference.

What is claimed is:

1. A method for manufacturing a photoelectric conversion device comprising:
   forming a fragile layer in a region at a predetermined depth from one surface of a single crystal silicon substrate;
   forming a first impurity silicon layer on the one surface side in the single crystal silicon substrate;
   forming a first electrode over the first impurity silicon layer;
   disposing a supporting substrate and the single crystal silicon substrate so that one surface of the supporting substrate and the one surface of the single crystal silicon substrate face each other;
   bonding the single crystal silicon substrate with the supporting substrate with at least the first impurity silicon layer and the first electrode interposed therebetween;
   forming a single crystal silicon layer over the supporting substrate by separating the single crystal silicon substrate along the fragile layer or vicinity of the fragile layer with heat treatment;
   performing crystal defect repair treatment of the single crystal silicon layer;
   forming a silicon layer while epitaxially growing the silicon layer using the single crystal silicon layer as a seed layer by activating a source gas containing at least a silane-based gas with plasma generated at atmospheric pressure or near atmospheric pressure; and
   forming a second impurity silicon layer on a surface side in the single crystal silicon layer which is epitaxial grown.

2. The method for manufacturing a photoelectric conversion device according to claim 1,
   wherein the atmospheric pressure or near atmospheric pressure is in a range of 0.1 atm to 10 atm.

3. The method for manufacturing a photoelectric conversion device according to claim 1,
   wherein the crystal defect repair treatment is laser treatment or heat treatment using a furnace.

4. The method for manufacturing a photoelectric conversion device according to claim 1,
   wherein the crystal defect repair treatment is RTA treatment or flash lamp irradiation.

5. The method for manufacturing a photoelectric conversion device according to claim 1,
   wherein the silane-based gas is silane, disilane, or trisilane.

6. The method for manufacturing a photoelectric conversion device according to claim 1,
   wherein a rare gas or hydrogen is added to the source gas.

7. The method for manufacturing a photoelectric conversion device according to claim 1,
   wherein the fragile layer is formed by irradiating the single crystal silicon substrate with ions or cluster ions through the one surface of the single crystal silicon substrate.

8. The method for manufacturing a photoelectric conversion device according to claim 1,
   wherein a region of the single crystal silicon layer which is epitaxially grown is an intrinsic semiconductor.

9. The method for manufacturing a photoelectric conversion device according to claim 1 further comprising:
   forming a third impurity silicon layer having one conductivity type over the second impurity silicon layer;
   forming a non-single-crystal silicon layer over the third impurity silicon layer; and
   forming a fourth impurity silicon layer having a conductivity type opposite to the one conductivity type over the non-single-crystal silicon layer.

10. The method for manufacturing a photoelectric conversion device according to claim 1, wherein the first electrode is in contact with a surface of the supporting substrate.

11. The method for manufacturing a photoelectric conversion device according to claim 7,
    wherein the ions or cluster ions with which the single crystal silicon substrate is irradiated include high proportion of $H_3^+$ ions.

12. A method for manufacturing a photoelectric conversion device comprising:
    forming a fragile layer in a region at a predetermined depth from one surface of a single crystal silicon substrate;
    forming a first impurity silicon layer on the one surface side in the single crystal silicon substrate;
    forming a first electrode over the first impurity silicon layer;
    disposing a supporting substrate and the single crystal silicon substrate so that one surface of the supporting substrate and the one surface of the single crystal silicon substrate face each other;
    bonding the single crystal silicon substrate with the supporting substrate with at least the first impurity silicon layer and the first electrode interposed therebetween;
    forming a single crystal silicon layer over the supporting substrate by separating the single crystal silicon substrate along the fragile layer or vicinity of the fragile layer with heat treatment;
    performing crystal defect elimination treatment of the single crystal silicon layer;
    forming a silicon layer while epitaxially growing the silicon layer using the single crystal silicon layer as a seed layer by activating a source gas containing at least a silane-based gas with plasma generated at atmospheric pressure or near atmospheric pressure; and
    forming a second impurity silicon layer on a surface side in the single crystal silicon layer which is epitaxial grown.

13. The method for manufacturing a photoelectric conversion device according to claim 12,
    wherein the atmospheric pressure or near atmospheric pressure is in a range of 0.1 atm to 10 atm.

14. The method for manufacturing a photoelectric conversion device according to claim 12,
    wherein the crystal defect elimination treatment is etching treatment.

15. The method for manufacturing a photoelectric conversion device according to claim 12,
    wherein the crystal defect elimination treatment is CMP treatment.

16. The method for manufacturing a photoelectric conversion device according to claim 12,
    wherein the silane-based gas is silane, disilane, or trisilane.

17. The method for manufacturing a photoelectric conversion device according to claim 12,
    wherein a rare gas or hydrogen is added to the source gas.

18. The method for manufacturing a photoelectric conversion device according to claim 12, wherein the fragile layer is formed by irradiating the single crystal silicon substrate with ions or cluster ions through the one surface of the single crystal silicon substrate.

19. The method for manufacturing a photoelectric conversion device according to claim 12,
   wherein a region of the single crystal silicon layer which is epitaxially grown is an intrinsic semiconductor.

20. The method for manufacturing a photoelectric conversion device according to claim 12 further comprising:
   forming a third impurity silicon layer having one conductivity type over the second impurity silicon layer;
   forming a non-single-crystal silicon layer over the third impurity silicon layer; and
   forming a fourth impurity silicon layer having a conductivity type opposite to the one conductivity type over the non-single-crystal silicon layer.

21. The method for manufacturing a photoelectric conversion device according to claim 12, wherein the first electrode is in contact with a surface of the supporting substrate.

22. The method for manufacturing a photoelectric conversion device according to claim 18,
   wherein the ions or cluster ions with which the single crystal silicon substrate is irradiated include high proportion of $H_3^+$ ions.

23. A method for manufacturing a photoelectric conversion device comprising:
   forming a fragile layer in a region at a predetermined depth from one surface of a single crystal silicon substrate;
   forming a first impurity silicon layer on the one surface side in the single crystal silicon substrate;
   forming a first electrode over the first impurity silicon layer;
   forming an insulating layer over the first electrode;
   disposing a supporting substrate and the single crystal silicon substrate so that one surface of the supporting substrate and the one surface of the single crystal silicon substrate face each other;
   bonding the single crystal silicon substrate with the supporting substrate with at least the first impurity silicon layer and the first electrode interposed therebetween;
   forming a single crystal silicon layer over the supporting substrate by separating the single crystal silicon substrate along the fragile layer or vicinity of the fragile layer with heat treatment;
   performing crystal defect repair treatment of the single crystal silicon layer;
   forming a silicon layer while epitaxially growing the silicon layer using the single crystal silicon layer as a seed layer by activating a source gas containing at least a silane-based gas with plasma generated at atmospheric pressure or near atmospheric pressure; and
   forming a second impurity silicon layer on a surface side in the single crystal silicon layer which is epitaxial grown.

24. The method for manufacturing a photoelectric conversion device according to claim 23,
   wherein the atmospheric pressure or near atmospheric pressure is in a range of 0.1 atm to 10 atm.

25. The method for manufacturing a photoelectric conversion device according to claim 23,
   wherein the crystal defect repair treatment is laser treatment, or heat treatment using a furnace.

26. The method for manufacturing a photoelectric conversion device according to claim 23,
   wherein the crystal defect repair treatment is RTA treatment or flash lamp irradiation.

27. The method for manufacturing a photoelectric conversion device according to claim 23,
   wherein the silane-based gas is silane, disilane, or trisilane.

28. The method for manufacturing a photoelectric conversion device according to claim 23,
   wherein a rare gas or hydrogen is added to the source gas.

29. The method for manufacturing a photoelectric conversion device according to claim 23, wherein the fragile layer is formed by irradiating the single crystal silicon substrate with ions or cluster ions through the one surface of the single crystal silicon substrate.

30. The method for manufacturing a photoelectric conversion device according to claim 23,
   wherein a region of the single crystal silicon layer which is epitaxially grown is an intrinsic semiconductor.

31. The method for manufacturing a photoelectric conversion device according to claim 23 further comprising:
   forming a third impurity silicon layer having one conductivity type over the second impurity silicon layer;
   forming a non-single-crystal silicon layer over the third impurity silicon layer; and
   forming a fourth impurity silicon layer having a conductivity type opposite to the one conductivity type over the non-single-crystal silicon layer.

32. The method for manufacturing a photoelectric conversion device according to claim 23, wherein the insulating layer is in contact with a surface of the supporting substrate.

33. The method for manufacturing a photoelectric conversion device according to claim 29,
   wherein the ions or cluster ions with which the single crystal silicon substrate is irradiated include high proportion of $H_3^+$ ions.

34. A method for manufacturing a photoelectric conversion device comprising:
   forming a fragile layer in a region at a predetermined depth from one surface of a single crystal silicon substrate;
   forming a first impurity silicon layer on the one surface side in the single crystal silicon substrate;
   forming a first electrode over the first impurity silicon layer;
   forming an insulating layer over the first electrode;
   disposing a supporting substrate and the single crystal silicon substrate so that one surface of the supporting substrate and the one surface of the single crystal silicon substrate face each other;
   bonding the single crystal silicon substrate with the supporting substrate with at least the first impurity silicon layer and the first electrode interposed therebetween;
   forming a single crystal silicon layer over the supporting substrate by separating the single crystal silicon substrate along the fragile layer or vicinity of the fragile layer with heat treatment;
   performing crystal defect elimination treatment of the single crystal silicon layer;
   forming a silicon layer while epitaxially growing the silicon layer using the single crystal silicon layer as a seed layer by activating a source gas containing at least a silane-based gas with plasma generated at atmospheric pressure or near atmospheric pressure; and
   forming a second impurity silicon layer on a surface side in the single crystal silicon layer which is epitaxial grown.

35. The method for manufacturing a photoelectric conversion device according to claim 34,
   wherein the atmospheric pressure or near atmospheric pressure is in a range of 0.1 atm to 10 atm.

36. The method for manufacturing a photoelectric conversion device according to claim 34,
   wherein the crystal defect elimination treatment is etching treatment.

37. The method for manufacturing a photoelectric conversion device according to claim 34,
   wherein the crystal defect elimination treatment is CMP treatment.

38. The method for manufacturing a photoelectric conversion device according to claim 34,
   wherein the silane-based gas is silane, disilane, or trisilane.

39. The method for manufacturing a photoelectric conversion device according to claim 34,
   wherein a rare gas or hydrogen is added to the source gas.

40. The method for manufacturing a photoelectric conversion device according to claim 34, wherein the fragile layer is formed by irradiating the single crystal silicon substrate with ions or cluster ions through the one surface of the single crystal silicon substrate.

41. The method for manufacturing a photoelectric conversion device according to claim 34,
   wherein a region of the single crystal silicon layer which is epitaxially grown is an intrinsic semiconductor.

42. The method for manufacturing a photoelectric conversion device according to claim 34 further comprising:
   forming a third impurity silicon layer having one conductivity type over the second impurity silicon layer;
   forming a non-single-crystal silicon layer over the third impurity silicon layer; and
   forming a fourth impurity silicon layer having a conductivity type opposite to the one conductivity type over the non-single-crystal silicon layer.

43. The method for manufacturing a photoelectric conversion device according to claim 34, wherein the insulating layer is in contact with a surface of the supporting substrate.

44. The method for manufacturing a photoelectric conversion device according to claim 40,
   wherein the ions or cluster ions with which the single crystal silicon substrate is irradiated include high proportion of $H_3^+$ ions.

45. A method for manufacturing a photoelectric conversion device comprising:
   preparing a single crystal silicon layer over a stack of a substrate, a first electrode, and a first impurity silicon layer;
   performing crystal defect repair treatment of the single crystal silicon layer;
   forming a silicon layer while epitaxially growing the silicon layer using the single crystal silicon layer as a seed layer by activating a source gas containing at least a silane-based gas with plasma generated at atmospheric pressure or near atmospheric pressure; and
   forming a second impurity silicon layer on a surface side in the single crystal silicon layer which is epitaxially grown.

46. The method for manufacturing a photoelectric conversion device according to claim 45,
   wherein the crystal defect repair treatment is laser treatment or heat treatment using a furnace.

47. The method for manufacturing a photoelectric conversion device according to claim 45,
   wherein the crystal defect repair treatment is RTA treatment or flash lamp irradiation.

48. A method for manufacturing a photoelectric conversion device comprising:
   preparing a single crystal silicon layer over a stack of a substrate, a first electrode, and a first impurity silicon layer;
   performing crystal defect elimination treatment of the single crystal silicon layer;
   forming a silicon layer while epitaxially growing the silicon layer using the single crystal silicon layer as a seed layer by activating a source gas containing at least a silane-based gas with plasma generated at atmospheric pressure or near atmospheric pressure; and
   forming a second impurity silicon layer on a surface side in the single crystal silicon layer which is epitaxially grown.

49. The method for manufacturing a photoelectric conversion device according to claim 48,
   wherein the crystal defect elimination treatment is etching treatment.

50. The method for manufacturing a photoelectric conversion device according to claim 48,
   wherein the crystal defect elimination treatment is CMP treatment.

* * * * *